(12) United States Patent
Osawa et al.

(10) Patent No.: US 9,470,820 B2
(45) Date of Patent: Oct. 18, 2016

(54) MICROLENS ARRAY, IMAGE PICKUP ELEMENT PACKAGE, AND METHOD FOR MANUFACTURING MICROLENS ARRAY

(71) Applicant: ASAHI GLASS COMPANY, LIMITED, Chiyoda-ku (JP)

(72) Inventors: Mitsuo Osawa, Tokyo (JP); Atsushi Matsuo, Tokyo (JP); Shuichi Yamashita, Tokyo (JP)

(73) Assignee: ASAHI GLASS COMPANY, LIMITED, Chiyoda-ku (JP)

( * ) Notice: Subject to any disclaimer, the term of this patent is extended or adjusted under 35 U.S.C. 154(b) by 0 days.

(21) Appl. No.: 14/604,304

(22) Filed: Jan. 23, 2015

(65) Prior Publication Data

US 2015/0168611 A1    Jun. 18, 2015

Related U.S. Application Data

(63) Continuation of application No. PCT/JP2013/070393, filed on Jul. 26, 2013.

(30) Foreign Application Priority Data

Jul. 31, 2012    (JP) .................. 2012-169541

(51) Int. Cl.
| | |
|---|---|
| H04N 5/225 | (2006.01) |
| G02B 3/00 | (2006.01) |
| H01L 27/146 | (2006.01) |
| G02B 5/20 | (2006.01) |
| G02B 5/28 | (2006.01) |
| G02B 13/14 | (2006.01) |

(52) U.S. Cl.
CPC ........... *G02B 3/0031* (2013.01); *G02B 3/0018* (2013.01); *G02B 5/208* (2013.01); *G02B 5/283* (2013.01); *G02B 13/143* (2013.01); *H01L 27/14618* (2013.01); *H01L 27/14627* (2013.01); *H01L 27/14685* (2013.01); *H01L 2924/0002* (2013.01)

(58) Field of Classification Search
CPC .................................................... G02B 3/0031
See application file for complete search history.

(56) References Cited

U.S. PATENT DOCUMENTS

2014/0376097 A1    12/2014  Yamashita et al.

FOREIGN PATENT DOCUMENTS

| | | |
|---|---|---|
| JP | 06-130205 | 5/1994 |
| JP | 06-148622 | 5/1994 |
| JP | 2002-365621 | 12/2002 |

(Continued)

OTHER PUBLICATIONS

International Search Report issued Aug. 27, 2013 in PCT/JP2013/070393 filed Jul. 26, 2013.

*Primary Examiner* — Gary C Vieaux
(74) *Attorney, Agent, or Firm* — Oblon, McClelland, Maier & Neustadt, L.L.P.

(57) ABSTRACT

The present invention relates to a microlens array comprising a transparent substrate, a resin layer provided on/above at least one surface of the transparent substrate, containing a photosensitive resin and forming a plurality of microlenses, and a functional layer reflecting at least light for reacting the photosensitive resin, the functional layer is formed on a surface of the transparent substrate at a side on which the resin layer is not formed, or on the surface of the transparent substrate at the side on which the resin layer is formed and at a position nearer the transparent substrate than the resin layer.

10 Claims, 13 Drawing Sheets

(56) References Cited

FOREIGN PATENT DOCUMENTS

| | | |
|---|---|---|
| JP | 2003-287603 | 10/2003 |
| JP | 2005-055452 | 3/2005 |
| JP | 2007-008052 | 1/2007 |
| JP | 2008-152039 | 7/2008 |
| JP | 2008-294741 | 12/2008 |
| JP | 2009-279774 | 12/2009 |
| JP | 2012-34215 | 2/2012 |
| WO | WO 2010-119725 | 10/2010 |
| WO | WO 2012/014494 | 2/2012 |

MICROLENS ARRAY, IMAGE PICKUP ELEMENT PACKAGE, AND METHOD FOR MANUFACTURING MICROLENS ARRAY

TECHNICAL FIELD

The present invention relates to a microlens array, an image pickup element package in which the microlens array and an image pickup element substrate are integrated, and a method for manufacturing a microlens array.

BACKGROUND ART

There is an image pickup device containing a microlens array placed above an incidence plane side of an image pickup element substrate having light receiving elements provided thereon corresponding to a given pixel pitch, in which light is incident in the light receiving elements through the microlens array to provide a desired light receiving signal.

Furthermore, in recent years, an image pickup device called a light field camera is being developed. The light field camera is a device containing microlenses provided above an upper surface of an image pickup element array substrate, which the microlenses are designed so as to make light incident on one microlens be received by a plurality of pixels, and additionally, to make pixel regions on which light is received through each microlens overlap partially, thereby covering the entire pixels of image pickup elements with the entire microlens array. When light is incident in a pixel array of the image pickup element through such a microlens array, depth information can be distributed and recorded in a plurality of pixels. For example, focus image is reconstructed on the basis of the depth information distributed and recorded in a plurality of pixels, and a variety of images such as a plurality focused images and three-dimensional range images can be obtained.

Thus, because many effects are obtained depending on the combination way with other member, a microlens array is expected to be used in various use applications. If the time required to manufacture a microlens array is shortened, productivity of the microlens array is further improved, and this is preferred.

Patent Document 1 describes the technique in which by providing a light shielding area on a side surface of a substrate that forms a microlens array, a curing speed of an ultraviolet ray curable adhesive applied to an adhered surface of the microlens array and a liquid crystal display panel is made uniform over the entire surface, to thereby suppress occurrence of panel gap defect.

Some image pickup devices using a solid image pickup element such as CCD (Charge Coupled Device) or CMOS image sensor (Complementary Metal Oxide Semiconductor Image Sensor) are equipped with a filter (optical filter) having various optical functions in order to favorably reproduce color tone and to obtain a clear image. The representative example is a filter (near infrared ray cut filter) that shields light of a near infrared wavelength region in order to correct spectral sensitivity of the solid image pickup element to human visibility, and is generally arranged between an image pickup lens and a solid image pickup element.

Other example is a filter (ultraviolet ray cut filter) that shields light of an ultraviolet wavelength region or a part thereof in order to prevent deterioration of an optical member in an image pickup device by ultraviolet rays incident from the outside or to correct sensitivity in ultraviolet region of a solid image pickup element, and is generally arranged at a position near as possible an optical component at an light incident side of the optical component having an optical member that is easy to be deteriorated.

For example, Patent Document 2 discloses an example in which an infrared ray cut filter is stored in a CCD package in a CCD camera. Patent Document 2 further describes an example in which in an image pickup device equipped with a light controlling device containing a guest-host type liquid crystal element for controlling light, a filter material that absorbs or reflects ultraviolet rays is provided at a light incident side of the liquid crystal element in order to prevent dye molecules used in the liquid crystal element from being excessively irradiated with ultraviolet rays.

Furthermore, in recent years, size reduction of an image pickup device using a solid image pickup element proceeds, and such an image pickup device is becoming to be mounted on a small-sized electronic equipment such as a mobile phone. Additionally, further size reduction is required even in an image pickup device along with size reduction and high functionality of an electronic equipment itself. To respond to such a requirement in further size reduction, it is performed that a filter material that absorbs or reflects light having a wavelength to be desired to be shielded is stacked on, for example, an uppermost layer at a light incident side of an optical component that achieves a specific optical function, such as an image pickup lens or an image pickup element, to thereby integratedly provide the original optical function and filter function.

For example, an example in which an ultraviolet ray cut filter is attached to the end of lenses positioned at an incident side of a light controlling device in order to prevent incidence of ultraviolet rays into the light controlling device is disclosed even in Patent Document 2.

PRIOR ART DOCUMENTS

Patent Document

[Patent Document 1] JP-A-06-148622
[Patent Document 2] JP-A-2002-365621

SUMMARY OF THE INVENTION

Problems that the Invention is to Solve

However, both of the techniques described in Patent Documents 1 and 2 do not improve productivity of a microlens array itself. For example, any of Patent Documents 1 and 2 does not take into consideration that a reflection film that reflects light of an ultraviolet wavelength region is positively provided on the entire main surface of a microlens array substrate in the case where it does not have a liquid crystal element in its back surface side.

Accordingly, the present invention has an object to provide a microlens array excellent in productivity, an image pickup element package and a method for manufacturing a microlens array.

Furthermore, the present invention has an object to provide a microlens array which has a near infrared cut filter function to an image pickup element used in combination with the microlens array and is excellent in productivity, an image pickup element package and a method for manufacturing a microlens array.

Means for Solving the Problems

A microlens array of the present invention is a microlens array to be used in combination with a pixel array of an image pickup element containing a transparent substrate, a resin layer provided on/above at least one surface of the transparent substrate, containing a photosensitive resin (photosensitive resin composition) and forming a plurality of microlenses, and a functional layer reflecting at least light for reacting the photosensitive resin, the functional layer is formed on a surface of the transparent substrate at a side on which the resin layer is not formed, or on the surface of the transparent substrate at the side on which the resin layer is formed and at a position nearer the transparent substrate than the resin layer.

A microlens array of the present invention is a microlens array to be used in combination with a pixel array of an image pickup element containing a transparent substrate, a resin layer provided on/above at least one surface of the transparent substrate, containing a photocurable resin (photocurable resin composition) and forming a plurality of microlenses, and a functional layer reflecting at least light for curing the photo curable resin, the functional layer is formed on a surface of the transparent substrate at a side on which the resin layer is not formed, or on the surface of the transparent substrate at the side on which the resin layer is formed and at a position nearer the transparent substrate than the resin layer.

A microlens array of the present invention is a microlens array to be used in combination with a pixel array of an image pickup element containing a transparent substrate, a resin layer provided on/above at least one surface of the transparent substrate, containing a photosoluble resin (photosoluble resin composition) and forming a plurality of microlenses, and a functional layer reflecting at least light for solubilizing the photosoluble resin, the functional layer is formed on a surface of the transparent substrate at a side on which the resin layer is not formed, or on the surface of the transparent substrate at the side on which the resin layer is formed and at a position nearer the transparent substrate than the resin layer.

A microlens array of the present invention is a microlens array to be used in combination with a pixel array of an image pickup element containing a transparent substrate made of a glass, having a plurality of microlenses formed on one surface thereof, and a functional layer reflecting at least light of an ultraviolet ray wavelength region, formed on/above a surface opposite to the surface having the microlenses formed thereon of the transparent substrate.

In the microlens array of the present invention, the functional layer may be a light reflection film containing a dielectric multilayer film that reflects at least light of an ultraviolet ray wavelength region.

In the microlens array of the present invention, the transparent substrate may be an infrared ray absorption glass that absorbs light of an infrared wavelength region.

The microlens array of the present invention may further contain an infrared light absorption film containing an infrared ray absorber that absorbs light of an infrared wavelength region stacked on the transparent substrate.

An image pickup element package of the present invention contains an image pickup element substrate on which a light receiving element is formed corresponding to a given pixel pitch, and any of the microlens array described above, fixed above the image pickup element substrate at an incident surface side thereof, in which each of a plurality of the microlenses contained in the microlens array makes light incident on the microlens be received by the light receiving element corresponding to a plurality of pixels on the image pickup element substrate, and the microlens array has a cut function of ultraviolet rays and near infrared rays into the light receiving element.

A method for manufacturing a microlens array of the present invention is a method for manufacturing a microlens array to be used in combination with a pixel array of an image pickup element containing providing a functional layer on one surface of a transparent substrate, and then applying a photosensitive resin as a material of a microlens or as a material of a photoresist used for transferring a shape of the microlens to the transparent substrate, on the other surface of the transparent substrate or on a surface of the functional layer, and emitting light in a state that the functional layer is present on a back surface rather than the surface having the photosensitive resin applied thereto from an exposure equipment, to expose the photosensitive resin, and in which the functional layer reflects light reacting the photosensitive resin.

A method for manufacturing a microlens array of the present invention is a method for manufacturing a microlens array to be used in combination with a pixel array of an image pickup element containing providing a functional layer on one surface of a transparent substrate, and then applying a photocurable resin as a material of a microlens or as a material of a photoresist used for transferring a shape of the microlens to the transparent substrate, on the other surface of the transparent substrate or on a surface of the functional layer, and emitting light in a state that the functional layer is present on a back surface rather than the surface having the photocurable resin applied thereto from an exposure equipment, to expose the photocurable resin, and in which the functional layer reflects light curing the photocurable resin.

A method for manufacturing a microlens array of the present invention is a method for manufacturing a microlens array to be used in combination with a pixel array of an image pickup element containing providing a functional layer on one surface of a transparent substrate, and then applying a photosoluble resin as a material of a microlens or as a material of a photoresist used for transferring a shape of the microlens to the transparent substrate, on the other surface of the transparent substrate or on a surface of the functional layer, and emitting light in a state that the functional layer is present on a back surface rather than the surface having the photosoluble resin applied thereto from an exposure equipment, to expose the photosoluble resin, and in which the functional layer reflects light solubilizing the photosoluble resin.

Advantageous Effects of the Invention

According to the present invention, a microlens array excellent in productivity, an image pickup element package and a method for manufacturing a microlens array can be provided. Furthermore, according to the present invention, a microlens array having a near infrared cut filter function to an image pickup element used in combination with an microlens array and being excellent in productivity, an image pickup element package, and a method for manufacturing a microlens array can be provided.

MODE FOR CARRYING OUT THE INVENTION

First Embodiment

Figures 1, 2:
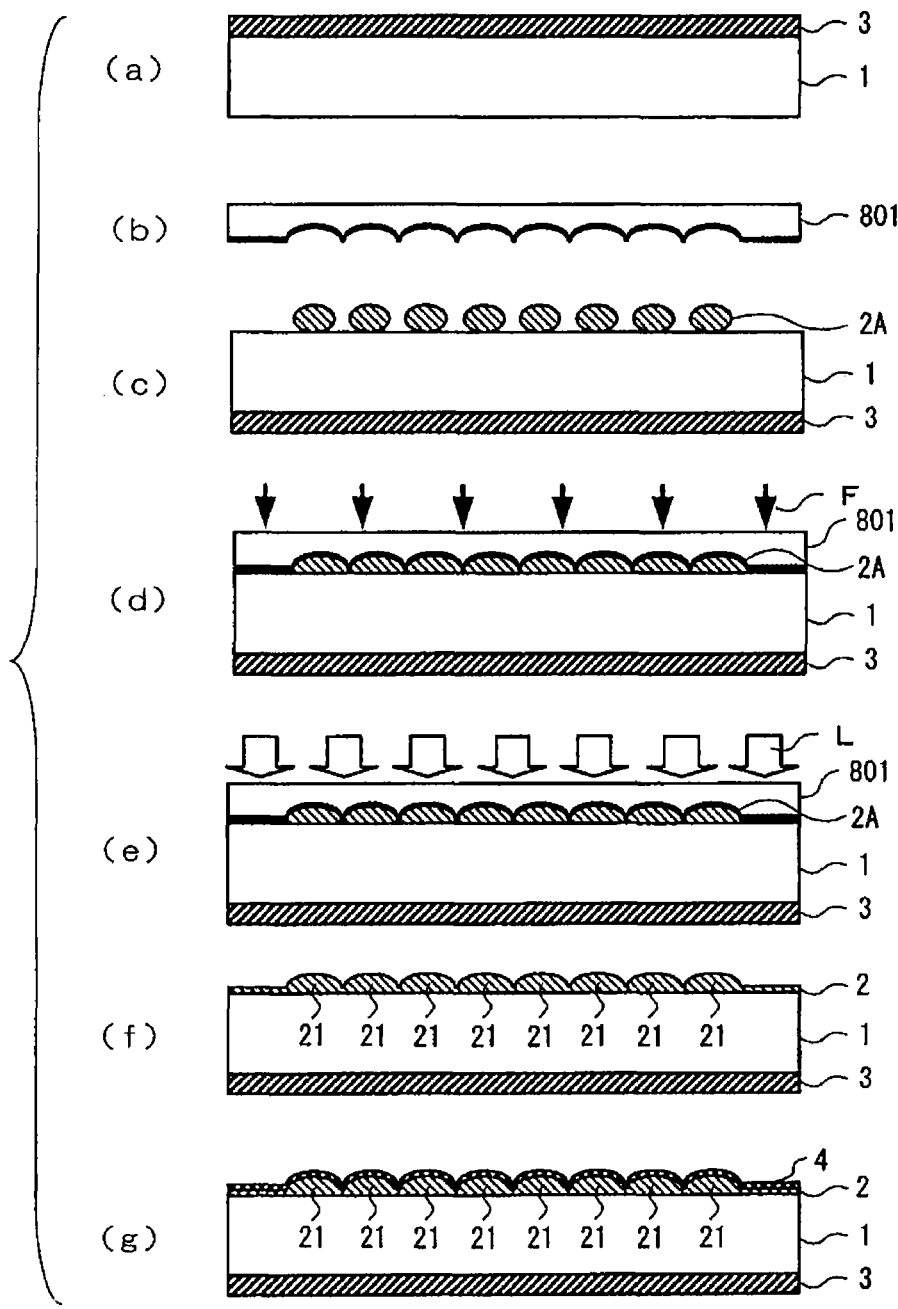
FIG. 1 is a cross-sectional view schematically illustrating a microlens array 10 according to a first embodiment of the present invention.
FIG. 2 is an explanatory view illustrating one example of a method for manufacturing the microlens array 10 in the first embodiment of the present invention.

First embodiment of the present invention is described below by reference to the drawings. FIG. 1 is a cross-sectional view schematically illustrating a microlens array 10 according to the first embodiment of the present invention. The microlens array 10 illustrated in FIG. 1 is equipped with a transparent substrate 1, a resin layer 2 provided on one light-transmitting surface of the transparent substrate 1 and having a plurality of microlenses 21 formed on the surface thereof, and a light reflection film 3 provided on the other light-transmitting surface of the transparent substrate 1. Further, an antireflection film 4 is provided on the resin layer 2.

The plurality of the microlenses 21 are arranged in an array shape on the surface of the resin layer 2, thereby forming a microlens array structure in the resin layer 2. The microlens array structure used herein means a structure body formed by arranging a plurality of microlenses in an array shape. In the present invention, the term "microlens array" means an entire structure in which a microlens array structure is provided on a substrate. That is, the term is used as a general term of an optical component having a microlens array structure integrally formed on a substrate. The microlens array structure may be directly formed on a substrate constituting a base, and may be formed on a resin layer or on an inorganic material layer such as $SiO_2$ or $Ta_2O_3$ which is stacked on a substrate constituting a base as illustrated in FIG. 1. If the microlens array structure is integrally formed with a substrate, it is considered that the microlens array structure is provided on a substrate even though other functional layer is present between those.

The transparent substrate 1, the resin layer 2, the light reflection film 3, and the antireflection film 4 that constitute the microlens array 10 of the present embodiment are described in detail below.

The resin layer 2 having a microlens array structure in the present embodiment is formed on a main surface of the transparent substrate 1 by a photocurable resin that cures by light of an ultraviolet wavelength region or the like.

Any photocurable resin can be used without particular limitation so long as it cures by light and after curing, it permits to pass light of a wavelength region that the microlens array 10 as a lens should transmit therethrough. For example, an ultraviolet ray curable resin that cures by light of an ultraviolet wavelength region (for example, light having a wavelength of from 200 to 400 nm), and an infrared ray curable resin that cures by light of an infrared wavelength region are mentioned. In the case where the light of wavelength region that the microlens array 10 as a lens should transmit therethrough is limited to a partial region of a visible wavelength region, the photocurable resin may be a resin that cures by light within a visible wavelength region excluding the region (for example, light of a green wavelength region).

Mainly the transparent substrate 1 functions as a base in forming a microlens array structure utilizing the photocurable resin. Additionally, when a package is formed by adhering with an image pickup element, the transparent substrate 1 may play a role of a cover glass of the image pickup element, and furthermore can give an effect of imparting or enhancing a near infrared cut function to the image pickup element.

In the case of the constitution illustrated in FIG. 1, the transparent substrate 1 may be any transparent substrate so long as it permits to pass light of a wavelength region that the microlens array 10 as a lens should transmit therethrough and light used in curing a photocurable resin that is a material of the resin layer 2 having a microlens array structure. The case where light of a wavelength region that should transmit when the microlens array 10 functions as a lens is light of a visible wavelength region is described below as an example.

Examples of a constituent material of the transparent substrate 1 include crystals such as glass, quartz, lithium niobate, and sapphire, polyester resins such as polyethylene terephthalate (PET) and polybutylene terephthalate (PBT), polyolefin resins such as polyethylene, polypropylene and an ethylene-vinyl acetate copolymer, norbornene resins, acrylic resins such as polyacrylate and polymethyl methacrylate, urethane resins, vinyl chloride resins, fluorine resins, polycarbonate resins, polyvinyl butyral resins, and polyvinyl alcohol resins. Those materials may have absorption characteristics in an infrared wavelength region. For example, the material may be an infrared ray absorbing glass or a resin containing an infrared ray absorbent.

The glass can be used by appropriately selecting from materials transparent in a visible wavelength region. For example, a borosilicate glass is easy to process and can suppress generation of damage, contamination and the like on an optical surface, and is therefore preferred, and a glass free of an alkali component has good adhesiveness, weather resistance and the like, and is therefore preferred.

A light absorption type glass having absorption in an infrared wavelength region, in which CuO and the like have been added to a fluorophosphate-based glass or a phosphate-based glass can be used as the glass. Particularly, the fluorophosphate-based glass or phosphate-based glass, having CuO added thereto has high transmittance to light of a visible wavelength region, and additionally can give good near infrared ray cut function since CuO sufficiently absorbs light of a near infrared wavelength region.

Specific examples of the fluorophosphate-based glass containing CuO include a glass containing from 0.5 to 7 parts by weight of CuO based on 100 parts by weight of a base glass containing, in mass %, from 46 to 70% of $P_2O_5$, from 0.2 to 20% of $AlF_3$, from 1 to 50% of $MgF_2+CaF_2+SrF_2+BaF_2+PbF_2$, from 0 to 25% of LiF+NaF+KF (provided that F is from 0.5 to 32%), and from 26 to 54% of O. NF-50 glass (trade name, manufactured by Asahi Glass Co., Ltd.) and the like are exemplified as a commercially available product.

Other specific examples of the fluorophosphate-based glass containing CuO include a glass containing from 0.2 to 15 parts by weight of CuO based on 100 parts by weight of a base glass which contains, in mass %, from 0.5 to 43% of $P_2O_5$, from 2.5 to 73% of $RF_2$ (in which R is at least one kind selected from Ba, Sr, Ca, Mg, Zn and Pb that are divalent metals), from 0 to 22% of R'F (in which R' is at least one kind selected from Li, Na and K that are monovalent metals), from 0 to 71% of R"Fm (in which R" is at least one kind selected from La, Y, Gd, Si, B, Zr, Ta and Yb that are trivalent to pentavalent metals, and m is the number corresponding to a valence of R"), and further contains a metal oxide so as to satisfy the following formula. C5000 glass (trade name, manufactured by Hoya Corporation) and the like are exemplified as a commercially available product.

$$y/(x+y)=0.05 \text{ to } 0.95$$

(in which x is a total amount of metal oxides (excluding $P_2O_5$), and y is a total amount of all fluorides).

Other specific examples of the fluorophosphate-based glass containing CuO include a glass that contains, in cation % representation, from 23 to 41% of $P^{5+}$, from 4 to 16% of $Al^{3+}$, from 11 to 40% of $Li^+$, from 3 to 13% of $Na^+$, from 12 to 53% of $R^{2+}$ (in which $R^{2+}$ is a total amount of $Mg^{2+}$, $Ca^{2+}$, $Sr^{2+}$, $Ba^{2+}$ and $Zn^{2+}$), and from 2.6 to 4.7% of $Cu^{2+}$, further contains, in anion % representation, from 25 to 48% of $F^-$ and from 52 to 75% of $O^{2-}$, does not substantially contain arsenic and lead, and has a liquidus temperature of 750° C. or lower. CD5000 glass (trade name, manufactured by Hoya Corporation) and the like are exemplified as a commercially available product.

Other than the above, a use of a material having the same or close coefficient of linear expansion as that of an image pickup element substrate or image pickup element package, to which the transparent substrate 1 is to be bonded (hereinafter simply referred to as a "bonded part"), as a material of the transparent substrate 1 can prevent deviation of a light-concentrating spot due to position deviation between a microlens array and a pixel array of an image pickup element when rising a temperature due to the difference in coefficients of thermal expansion. Therefore, such a material is preferred.

For example, when a material of the bonded part is silicon, a material having a coefficient of linear expansion of from about $0.3\times10^{-6}$ to $11\times10^{-6}$/K is preferred, a material having a coefficient of linear expansion of from about $0.3\times10^{-6}$ to $6\times10^{-6}$/K is more preferred, and a material having a coefficient of linear expansion of from about $2\times10^{-6}$ to $4\times10^{-6}$/K is still more preferred.

Furthermore, for example, when a material of the bonded part is germanium, a material having a coefficient of linear expansion of from about $0.3\times10^{-6}$ to $14\times10^{-6}$/K is preferred, a material having a coefficient of linear expansion of from about $3\times10^{-6}$ to $9\times10^{-6}$/K is more preferred, and a material having a coefficient of linear expansion of from about $5\times10^{-6}$ to $7\times10^{-6}$/K is still more preferred.

Furthermore, for example, when a material of the bonded part is a ceramic such as alumina, a material having a coefficient of linear expansion of from about $0.3\times10^{-6}$ to $15\times10^{-6}$/K is preferred, a material having a coefficient of linear expansion of from about $4\times10^{-6}$ to $10\times10^{-6}$/K is more preferred, and a material having a coefficient of linear expansion of from about $6\times10^{-6}$ to $8\times10^{-6}$/K is still more preferred.

As a material of the transparent substrate 1, a material having smaller amount of an α-ray emission can suppress noise generation in an image pickup element due to α-ray and damage of an image pickup element, and is therefore preferred. For example, 0.01 c/cm²·hr or less is preferred, and 0.005 c/cm²·hr or less is more preferred.

The thickness of the transparent substrate 1 is not particularly limited. From the standpoints of reduction in size and reduction in weight, a range of from 0.1 to 3 mm is preferred, and a range of from 0.1 to 1 mm is more preferred.

The light reflection film 3 is mainly provided to accelerate formation of the resin layer 2 having a microlens array structure. Therefore, the light reflection film 3 has at least the effect of reflecting light used in curing a photocurable resin that is a material of the resin layer 2. Simultaneously, it is possible to give an effect of imparting or enhancing a near infrared ray cut filer function.

For example, in the case where the light reflection film 3 is constituted as an ultraviolet/infrared light reflection film 3, the light reflection film 3 may be constituted from a dielectric multilayer film obtained by alternatively stacking a dielectric layer A and a dielectric layer B having a refractive index higher than a refractive index of the dielectric layer A by a sputtering method, a vacuum deposition method or the like.

A material having a refractive index of 1.6 or less, and preferably from 1.2 to 1.6, can be used as a material constituting the dielectric layer A. Specifically, silica ($SiO_2$), alumina, lanthanum fluoride, magnesium fluoride, sodium hexafluoroaluminate, and the like can be used. Furthermore, a material having a refractive index of 1.7 or more, and preferably from 1.7 to 2.5, can be used as a material constituting the dielectric layer B. Specifically, titania ($TiO_2$), zirconia, tantalum pentoxide, niobium pentoxide, lanthanum oxide, yttria, zinc oxide, zinc sulfide and the like can be used. The refractive index means a refractive index to light having a wavelength of 550 nm.

The dielectric multilayer film can be formed by an ion beam method, an ion plating method, a CVD method and the like, other than the above-described sputtering method and vacuum deposition method. The sputtering method and the ion plating method are so-called plasma atmosphere treatments. Therefore, adhesiveness to the transparent substrate 1 using a near infrared ray absorbing glass can be particularly improved.

The antireflection film 4 has a function of preventing reflection of light incident into the microlens array 10, thereby improving transmittance and efficiently utilizing incident light, and can be formed by a material and a method that are conventionally known. Specifically, the antireflection film 4 is constituted of a film of at least one layer of silica, titania, tantalum pentoxide, magnesium fluoride, zirconia, alumina or the like formed by a sputtering method, a vacuum deposition method, an ion beam method, an ion plating method, a CVD method or the like; or a silicate type, a silicone type, a fluoromethacrylate type or the like formed by a sol gel method, a coating method or the like. The thickness of the antireflection film 4 is generally a range of from 100 to 600 nm. The antireflection film 4 may be omitted, but is preferably used in order to efficiently utilize incident light.

In the present invention, a second light reflection film including a dielectric multilayer film that reflects at least light of an ultraviolet wavelength region may be provided on a surface opposite to the surface having the light reflection film 3 formed thereon of the transparent substrate 1 in place of the antireflection film 4, or between the antireflection film 4 and the transparent substrate 1. The second light reflection film may be a dielectric multilayer film that reflects light of an ultraviolet wavelength region and an infrared wavelength region.

The dielectric multilayer film constituting the second light reflection film is not particularly limited, and can be formed by the same method using the same material as in the dielectric multilayer film constituting the light reflection film 3. In the case where the light reflection film 3 is constituted of the above-described dielectric multilayer film in which incident angle dependency has been reduced, the second light reflection film is preferably constituted of the following dielectric multilayer film.

That is, the dielectric multilayer film is a stack of at least three layers of an unit dielectric layer including a low refractive index dielectric layer A having a refractive index of 1.6 or less and a high refractive index dielectric layer B having a refractive index of 2 or more.

A method for manufacturing the microlens array 10 of the present embodiment is described below. FIG. 2 is an explanatory view illustrating one example of a method for manufacturing the microlens array 10 of the present embodiment.

In the example illustrated in FIG. 2, the light reflection film 3 is first formed on one entire main surface of the transparent substrate 1 ((a) of FIG. 2). As the light reflection film 3, for example, a dielectric multilayer film that reflects light of an ultraviolet wavelength region (for example, the whole or a part of light having a wavelength of from 200 to 400 nm) may be formed. A formation method of the light reflection film 3 is as described before. For example, the film is formed by alternately stacking the dielectric layer A and the dielectric layer B having a refractive index higher than a refractive index of the dielectric layer A by a sputtering method, a vacuum deposition method or the like.

Next, the resin layer 2 having a microlens array structure is formed on the other main surface of the transparent substrate 1 having the light reflection film 3 formed thereon ((b) to (f) of FIG. 2).

In the method illustrated in FIG. 2, a transparent mold 801 corresponding to a surface shape of the side having a microlens array structure of the resin layer 2 to be formed is previously prepared ((b) of FIG. 2). In this case, a polymer-based SAM (self-assembled monomer) film or a DLC (diamond-like carbon) film may be applied as a mold release treatment to the surface of the transparent mold 801 in order to increase releasability to a material to be transferred (in this example, a photocurable resin). As a material of the transparent mold, a glass, a resin or the like can be used.

Next, a photocurable resin 2A that is a material of the resin layer 2 is applied as an imprint material to the main surface of a side on which the light reflection film 3 is not formed, of the transparent substrate 1 ((c) of FIG. 2). In this case, the photocurable resin 2A may be selectively applied, corresponding to the positions on which the individual microlenses 21 are formed. Furthermore, prior to the application, to enhance adhesiveness to the transparent substrate 1, a coupling treatment by hexamethyldisilazane (HMDS), a silane coupling agent or the like may be conducted on the surface of the transparent substrate 1.

Thereafter, the photocurable resin 2A is molded into a shape of the transparent mold 801, that is, a surface shape of the resin layer 2 having a microlens array structure by pushing the transparent mold 801 against the applied photocurable resin 2A to extend and spread the photocurable resin 2A on the transparent substrate 1 ((d) of FIG. 2). In (d) of FIG. 2, F indicates pushing force.

The photocurable resin 2A molded is irradiated with light through the transparent mold 801 to photocure the photocurable resin 2A ((e) of FIG. 2). Regarding the light L to be irradiated, for example, in the case where the photocurable resin 2A is a resin that cures by light of an ultraviolet wavelength region, light containing at least the light of such the ultraviolet wavelength region is irradiated. In the present embodiment, the light reflection film 3 including a dielectric multilayer film that reflects light of an ultraviolet wavelength region is provided at a back surface side rather than the surface to which the photocurable resin 2A becoming the resin layer 2 is applied, that is, on a back surface of the photocurable resin 2A from an exposure equipment. As a result, after passing through the photocurable resin 2A, the light that cures the photocurable resin 2A is reflected by the light reflection film 3, and returns to the photo curable resin 2A again. That is, the presence of the light reflection film 3 can contribute to the curing of the photocurable resin 2A, and the photocurable resin 2A can be rapidly cured.

Thereafter, the transparent mold 801 is removed to obtain the resin layer 2 having a microlens array structure, that is, a plurality of microlenses 21 arranged in an array shape, on the transparent substrate 1 ((f) of FIG. 2).

Finally, the antireflection film 4 is formed on the surface of the resin layer 2 at the side having a microlens array structure formed thereon, to obtain the microlens array 10 ((g) of FIG. 2). In the case of equipping with a second light reflection film, the second light reflection film may be formed in place of the antireflection film 4 or before forming the antireflection film 4. In the case where the second light reflection film is provided between the antireflection film 4 and the transparent substrate 1, for example, between the transparent substrate 1 and the resin layer 2, in (a) of FIG. 2, light reflection films are formed on both surfaces of the transparent substrate 1, in which one film is the light reflection film 3 and the other film is the second light reflection film.

Figure 3:
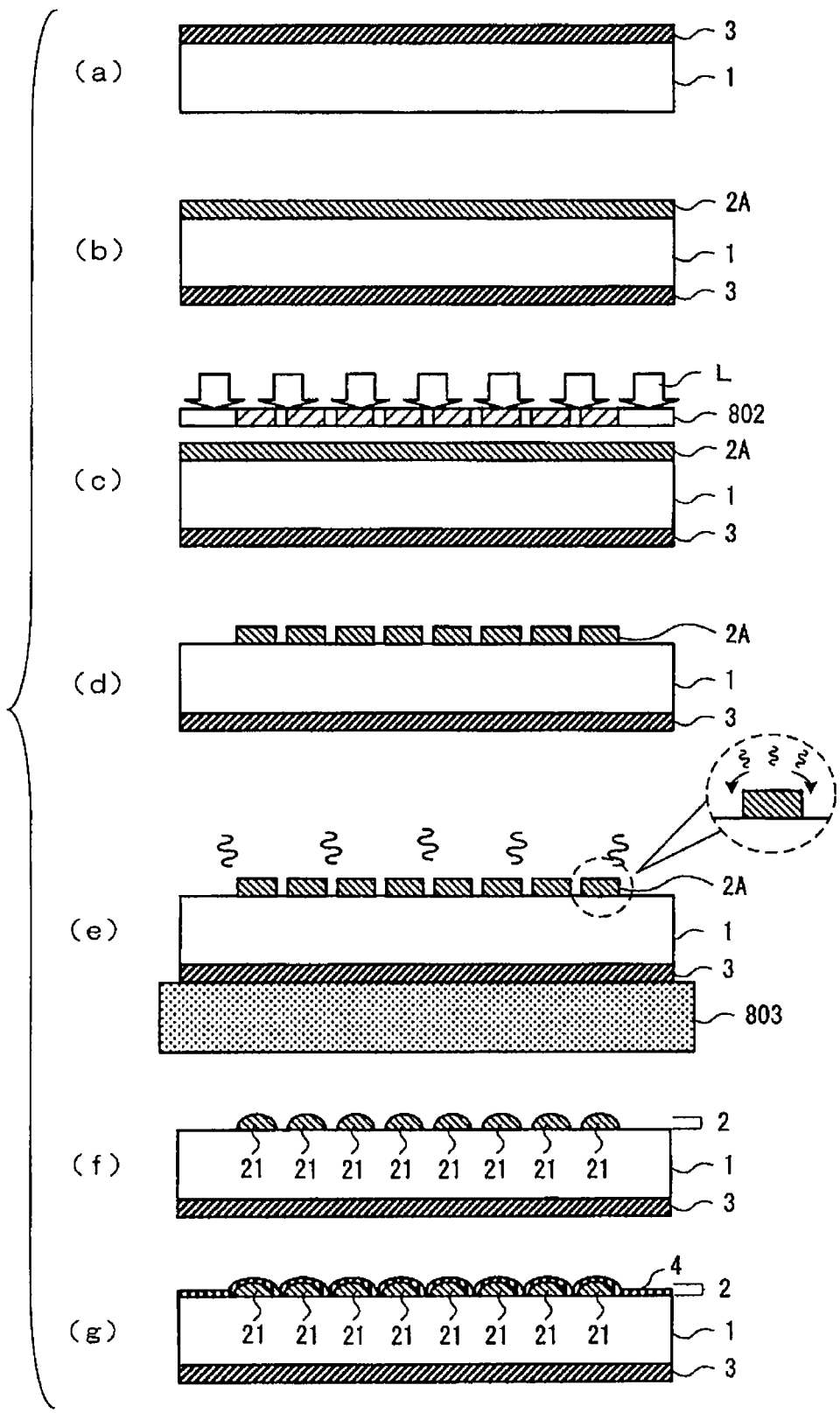
FIG. 3 is an explanatory view illustrating another example of the method for manufacturing the microlens array 10 in the first embodiment of the present invention.

The microlens array 10 of the present embodiment can be also prepared by the following method. FIG. 3 is an explanatory view illustrating the other example of the method for manufacturing the microlens array 10 of the present embodiment.

Even in the example illustrated in FIG. 3, the light reflection film 3 is first formed on one entire main surface of the transparent substrate 1 ((a) of FIG. 3). As the light reflection film 3, for example, a dielectric multilayer film that reflects light of an ultraviolet wavelength region (for example, the whole or a part of light having a wavelength of from 200 to 400 nm) may be formed.

The resin layer 2 having a microlens array structure is then formed on the other main surface of the transparent substrate 1 having the light reflection layer 3 formed thereon ((b) to (f) of FIG. 3).

In the method illustrated in FIG. 3, a resin film is first formed by applying a photocurable resin 2A that is a material of the resin layer 2 as a photolithography material on the entire surface at a side on which the light reflection film 3 is not formed, of the transparent substrate 1 ((b) of FIG. 3). As an application method of the photocurable resin, a spin coating method, a bar coating method, a dip coating method, a casting method, a spray coating method, a bead coating method, a wire bar coating method, a blade coating method, a roller coating method, a curtain coating method, a slit die coating method, a gravure coating method, a slit reverse coating method, a microgravure method, a comma coating method and the like can be used. The application may be carried out by dividing it into multiple operations. Furthermore, prior to the application, to enhance adhesiveness to the transparent substrate 1, a coupling treatment by hexamethyldisilazane (HMDS), a silane coupling agent or the like may be conducted on the surface of the transparent substrate 1.

Next, the photocurable resin 2A is irradiated with light L through a photomask 802 in which positions corresponding to the microlenses 21 in the resin layer 2 have been opened ((c) of FIG. 3). Regarding the light to be irradiated, for example, in the case where the photocurable resin 2A is a resin that cures by light of an ultraviolet wavelength region, light containing at least the light of such the ultraviolet wavelength region is irradiated. Thereby the photocurable resin 2A in the portion irradiated with light cures. Even in the example illustrated in FIG. 3, the light reflection film 3 including a dielectric multilayer film that reflects light of an ultraviolet wavelength region is provided on a back surface of the photocurable resin 2A from an exposure equipment. The presence of the light reflection film 3 in such a position relationship can contribute to the curing of the photocurable resin 2A, and the photocurable resin 2A can be rapidly cured.

Thereafter, the photocurable resin 2A on an unirradiated portion is selectively removed by development, thereby achieving the state where patterns having a cross-sectional shape of a rectangle of the photocured resin (hereinafter, each pattern is called pattern 2A) remain at positions on which the microlenses 21 are desired to be formed, on the transparent substrate 1 ((d) of FIG. 3). As the development, wet development, dry development or the like can be used. In the case of wet development, it can be conducted by the conventional method such as a dip method, a spray method, a paddle method, brushing, slapping using a developer corresponding to the kind of the photocurable resin 2A, such as an alkaline aqueous solution, an aqueous developer or an organic solvent.

Each pattern 2A of the photocured resin remained after the development step of (d) of FIG. 3 is then melted by thermal reflow to perform reflow ((e) of FIG. 3). In (e) of FIG. 3, 803 indicates a heating apparatus.

By the heating for a predetermined period of time, the resin layer 2 having a microlens array structure, that is, a plurality of microlenses 21 arranged in an array shape, on the transparent substrate 1 is obtained ((f) of FIG. 3).

In place of a series of steps of from the exposure step of (c) of FIG. 3 to the completion of the thermal reflow step of (f) of FIG. 3, a series of steps of conducting photolithography using a grayscale mask to give a curved surface shape to the photocurable resin 2A (steps illustrated in (c) to (f) of FIG. 4 described hereinafter) can be conducted.

Finally, an antireflection film 4 is formed on the surface of the resin layer 2 at the side having a microlens array structure formed thereon, to obtain the microlens array 10 ((g) of FIG. 3). Also in this example, similarly, in the case of equipping with a second light reflection film, the second light reflection film may be formed in this stage in place of the antireflection film 4 or before forming the antireflection film 4. In the case where the second light reflection film is provided between the antireflection film 4 and the transparent substrate 1, for example, between the transparent substrate 1 and the resin layer 2, light reflection films are formed on both surfaces of the transparent substrate 1 in (a) of FIG. 3, in which one film is the light reflection film 3 and other film is the second light reflection film.

Figure 4:
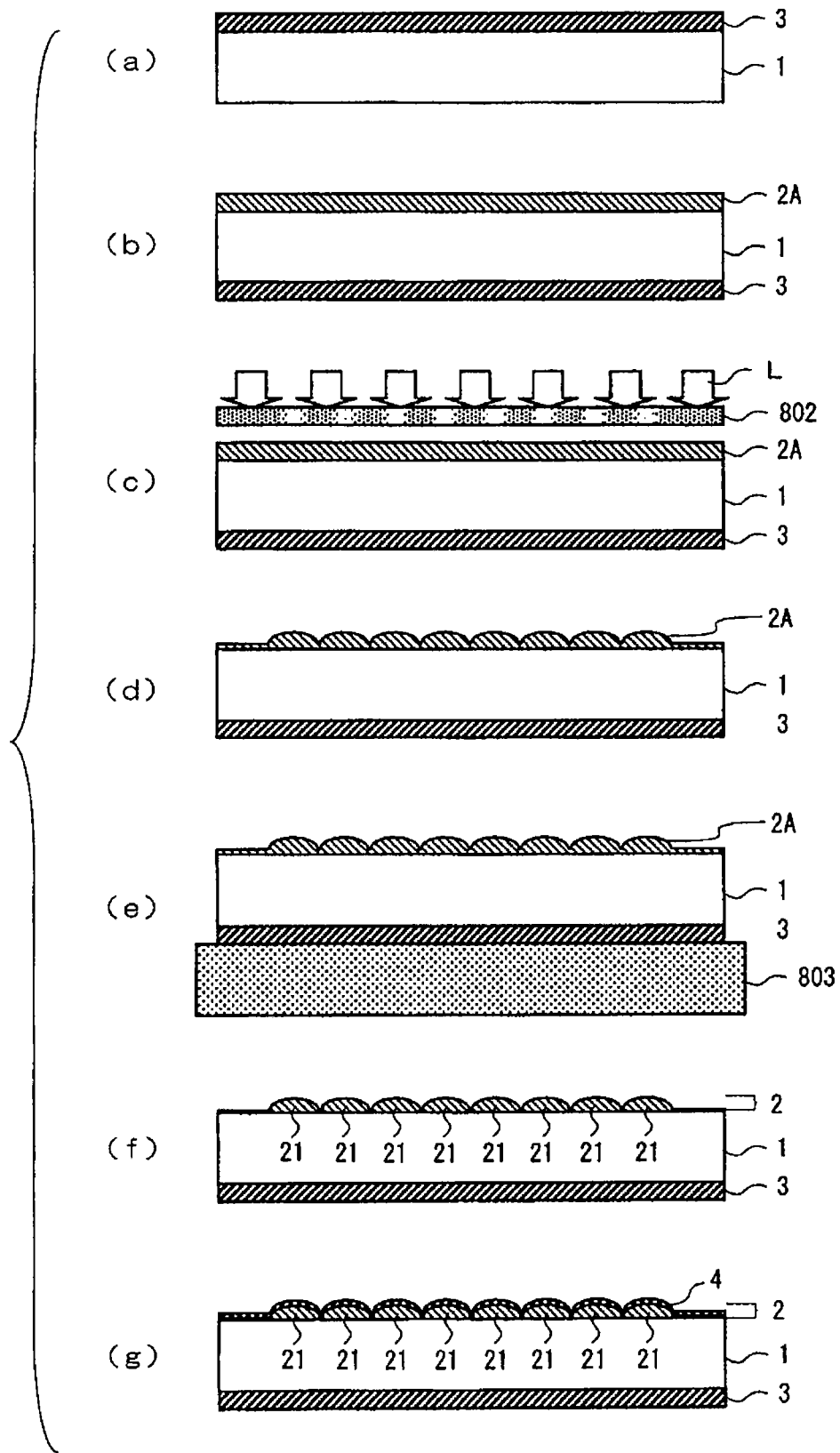
FIG. 4 is an explanatory view illustrating another example of the method for manufacturing the microlens array 10 in the first embodiment of the present invention.

FIG. 4 is an explanatory view illustrating another example of the method for manufacturing the microlens array 10 of the present embodiment. The steps of (a), (b) and (g) of FIG. 4 are the same as (a), (b) and (g) of FIG. 3, and therefore, those explanations are omitted.

In (c) to (f) of FIG. 4, a series of steps including a photolithography step using a grayscale mask is conducted. In (c) of FIG. 4, the photocurable resin 2A is irradiated with light L by using a grayscale mask, as the photomask 802, having a predetermined transmitted light intensity distribution designed on the basis of each lens shape of the microlenses 21. In the case of this example, for example, a grayscale mask having a transmitted light intensity distribution controlled such that transmittance is increased in a region in which a residual portion in the development step is desired to be increased, such as a position corresponding to a vicinity of a top of a lens, and transmittance is decreased in a region in which a residual portion in the development step is desired to be decreased, such as a position corresponding to a space between a lens and a lens, is used.

Next, the photocurable resin 2A on an unirradiated portion is selectively removed by development ((d) of FIG. 4). This achieves the state where the patterns 2A having a cross-sectional shape of a convex spherical surface shape of the photocured resin are formed at the positions on which the microlenses 21 are desired to be formed, on the transparent substrate 1. Each pattern 2A having a spherical surface shape can be formed without any space by controlling the transmitted light intensity distribution of the photomask.

The next (e) of FIG. 4 is a post-baking step. Reaction between resins in a photoresist proceeds by heating for a predetermined period of time to improve adhesiveness to a base and etching resistance. By the above steps, the resin layer 2 having a microlens array structure, that is, a plurality of microlenses 21 arranged in an array shape, on the transparent substrate 1 is obtained ((f) of FIG. 4).

Thus, in the microlens array 10 of the present embodiment, when viewing the surface at a side having a microlens array structure of the resin layer 2 as an upper surface, because the back surface side thereof is equipped with the light reflection film 3, the time required for curing can be shortened. Therefore, the resin layer 2 can be formed in a short period of time, and as a result, productivity of the microlens array 10 can be improved. Furthermore, in the case where the light reflection film 3 or the transparent substrate 1 absorbs or reflects infrared rays, a microlens array having a function of a near infrared cut filter to an image pickup element in addition to the improvement effect of productivity by the shortening of a production time can be provided. Furthermore, when a glass material having high heat resistance, adhesiveness, weather resistance and the like is used in the transparent substrate 1, durability of the microlens array 10 can be enhanced.

Figure 5:
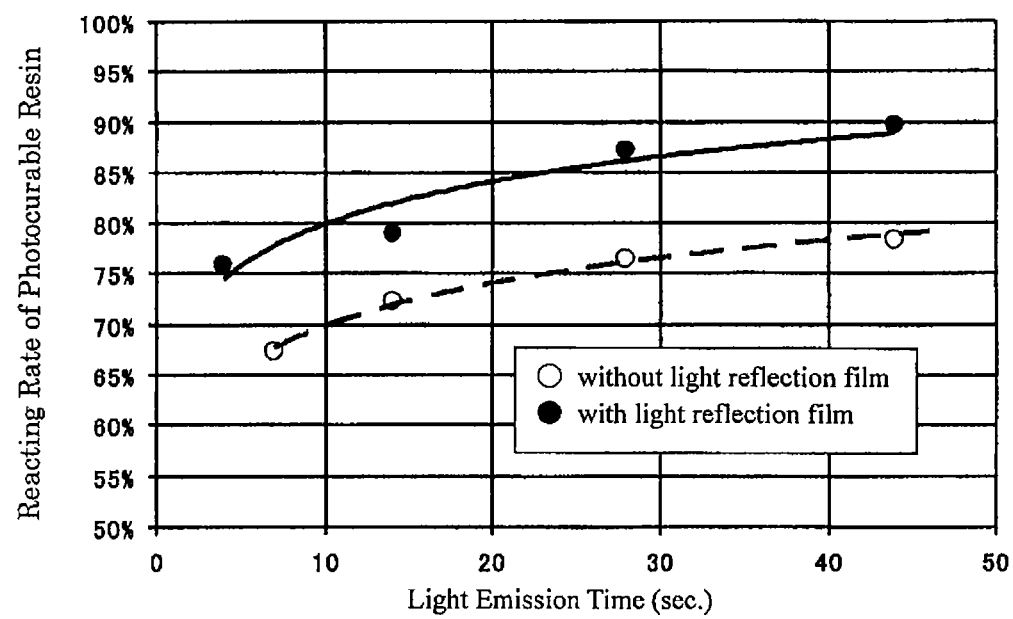
FIG. 5 is a graph showing change in curing characteristics of a photocurable resin by the presence or absence of a light reflection film 3.

FIG. 5 is a graph showing the result which is obtained by investigating, to confirm the effect by the light reflection film 3, the relationship between the exposure time to the photocurable resin 2A and the reaction rate of the cured photocurable resin 2A in the case where the resin layer 2 was formed without providing the light reflection film 3 on one main surface of the transparent substrate 1 ("without light reflection film" in FIG. 5) and in the case where the resin layer 2 was formed on the other surface of the transparent substrate 1 having the light reflection film 3 provided on one main surface of the transparent substrate 1 as illustrated in FIG. 1 ("with light reflection film" in FIG. 5). In the case where exposure amount to the photocurable resin 2A is insufficient, the reaction rate of the photocurable resin 2A to be cured is decreased.

As is apparent from the graph, the photocurable resin 2A having the light reflection film 3 on the back surface promptly cures even in a short period of time, whereas the photocurable resin 2A not having the light reflection film 3 requires much time to cure. Thus, the effect of the light reflection film 3 to curability of the photocurable resin 2A can be confirmed.

The example using a photo curable resin in a material of the resin layer 2 having a microlens array structure has been described in the forgoing description, but the material of microlenses may be any material so long as it is a photosensitive resin, and it is possible to use, for example, a photosoluble resin.

The photosensitive resin used in a photolithography process includes a negative type that insolubilizes by light and a positive type that solubilizes by light, and the above photocurable resin is generally called a negative photosensitive resin composition. In the case of the photocurable resin, an exposed portion (irradiated portion) cures by exposure, an unexposed portion is washed away by developing with a developer, and the exposed portion remains. On the other hand, the photosoluble resin is also called a positive photosensitive resin composition. An exposed portion solubilizes by exposure, the exposed portion is washed away by developing with a developer, and an unexposed portion remains.

The photosoluble resin as a material of the resin layer 2 is used without particular limitation so long as it is solubilized by light and it permits to pass light of a wavelength region that the microlens array as a lens should transmit therethrough after bleaching in an unexposed portion after light irradiation.

Furthermore, in the case of using the photosoluble resin, the transparent substrate 1 permits to pass light of a wavelength region that the microlens array 10 as a lens should transmit therethrough and light used when reacting the photosoluble resin that is a material of the resin layer 2 having a microlens array structure. In the manufacturing process, a mask in which negative/positive are inversed to the above-mentioned mask, in more specifically, an aperture ratio in an opening or of the in-plane, or height of transmittance is inversed, is used as the photomask 802.

Figure 6:
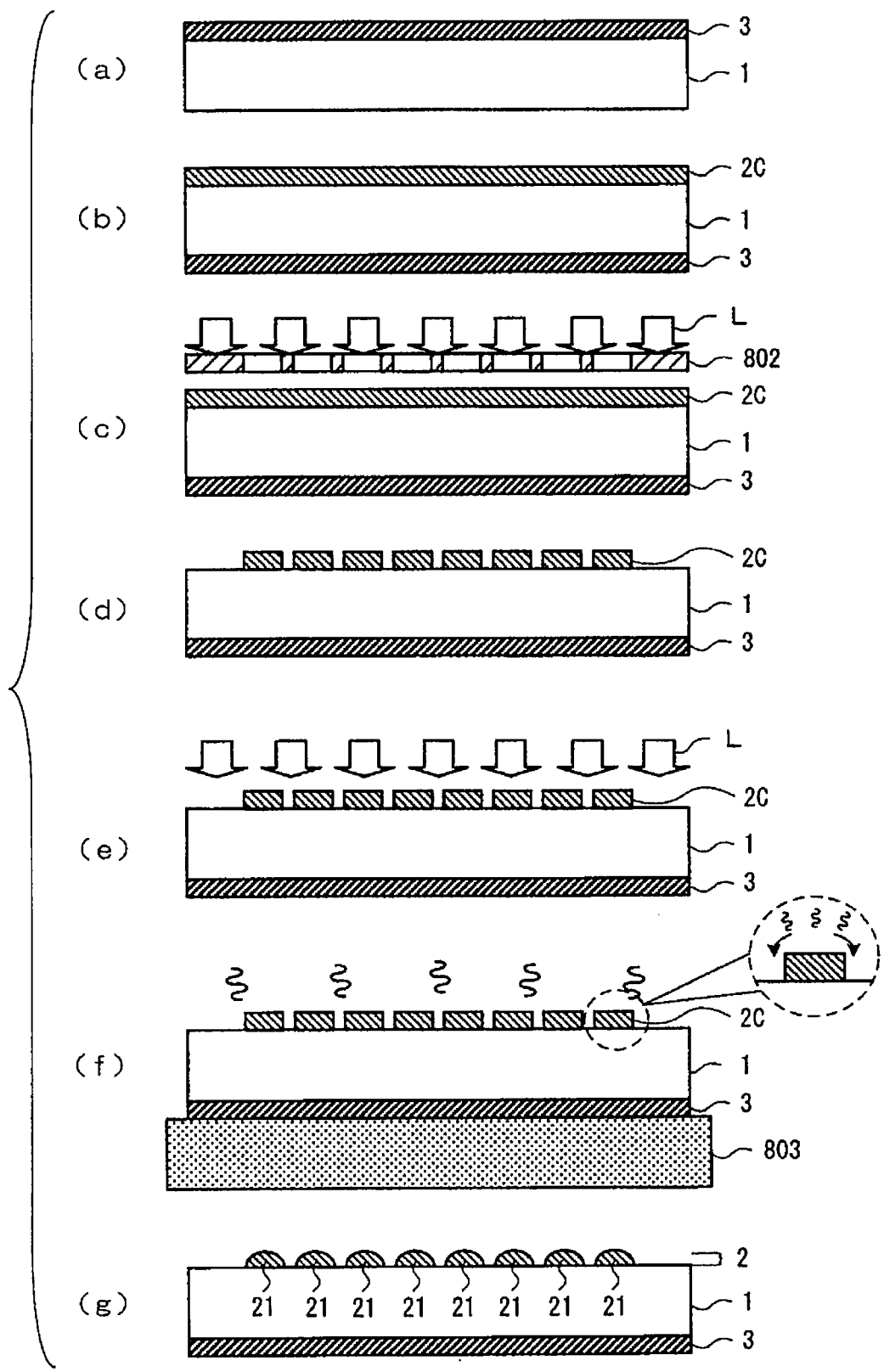
FIG. 6 is an explanatory view illustrating another example of the method for manufacturing the microlens array 10 in the first embodiment of the present invention.

FIG. 6 is an explanatory view illustrating one example of a method for manufacturing the microlens array 10 in the case of using a photosoluble resin as a material of the resin layer 2. In FIG. 6, steps of (g) of FIG. 6 and the subsequence are the same as the steps of (f) of FIG. 3 and the subsequence, and therefore the drawings thereof are omitted. Furthermore, the step illustrated in (a) of FIG. 6 is the same as the step illustrated in (a) of FIG. 3, and therefore the description thereof is omitted below.

After forming the light reflection film 3 by the same method as (a) of FIG. 3, then a photosoluble resin 2C that is a material of the resin layer 2 is applied as a photolithography material to the entire surface of the transparent substrate 1 at a side on which the light reflection film 3 is not formed, to form a resin film ((b) of FIG. 6). The method described as the application method of a photocurable resin can be similarly used as the application method of the photosoluble resin.

Next, the formed resin film is irradiated with light L through a photomask 802 in which positions corresponding to spaces between a lens and a lens of the microlenses 21 in the resin layer 2 have been opened ((c) of FIG. 6). Regarding the light to be irradiated, for example, in the case where the photosoluble resin 2C is a resin that reacts by light of an ultraviolet wavelength region, light containing at least the light of such the ultraviolet wavelength region is irradiated. Thereby the photosoluble resin 2C in the portion irradiated with the light solubilizes. Even in the example illustrated in FIG. 6, the light reflection film 3 including a dielectric multilayer film that reflects light of an ultraviolet wavelength region is provided on a back surface of the photosoluble resin 2C from an exposure equipment. The presence of the light reflection film 3 in such a position relationship can contributes to the reaction of the photosoluble resin 2C, and the photosoluble resin 2C can be rapidly solubilized.

Thereafter, the photosoluble resin 2C solubilized in an exposed portion of the resin film is dissolved and selectively removed by development, thereby achieving the state where patterns having a cross-sectional shape of a rectangle of a residual portion of the dissolved resin (hereinafter, each pattern is called pattern 2C) remain at the positions on which the microlenses 21 are desired to be formed, on the transparent substrate 1 ((d) of FIG. 6). As the development, wet development, dry development or the like can be used.

In the case of wet development, it can be conducted by the conventional method such as a dip method, a spray method, a paddle method, brushing, slapping using a developer corresponding to the kind of the photosoluble resin 2C, such as an alkaline aqueous solution, an aqueous developer or an organic solvent.

Next, the entire surface of the surface on which each pattern 2C is formed is again exposed ((e) of FIG. 6). This step is called bleaching, and unreacted PAC (Photo Active Compound) is reacted by again exposing after development to increase transmittance.

The subsequent steps are the same as FIG. 3. That is, each pattern 2C of the resin remained after the development step is melted by thermal reflow to perform reflow to obtain the resin layer 2 having a microlens array structure, that is, a plurality of microlenses 21 arranged in an array shape, on the transparent substrate 1 ((f) and (g) of FIG. 6). Even in this example, in place of a series of steps of from the exposure step of (c) of FIG. 6 to the completion of the thermal reflow step of (g) of FIG. 6, a series of steps including a photolithography step using a grayscale mask (steps illustrated in (c) to (g) of FIG. 7 described hereinafter) may be conducted to give a spherical surface shape to a resin film of the photosoluble resin 2C.

Figure 7:
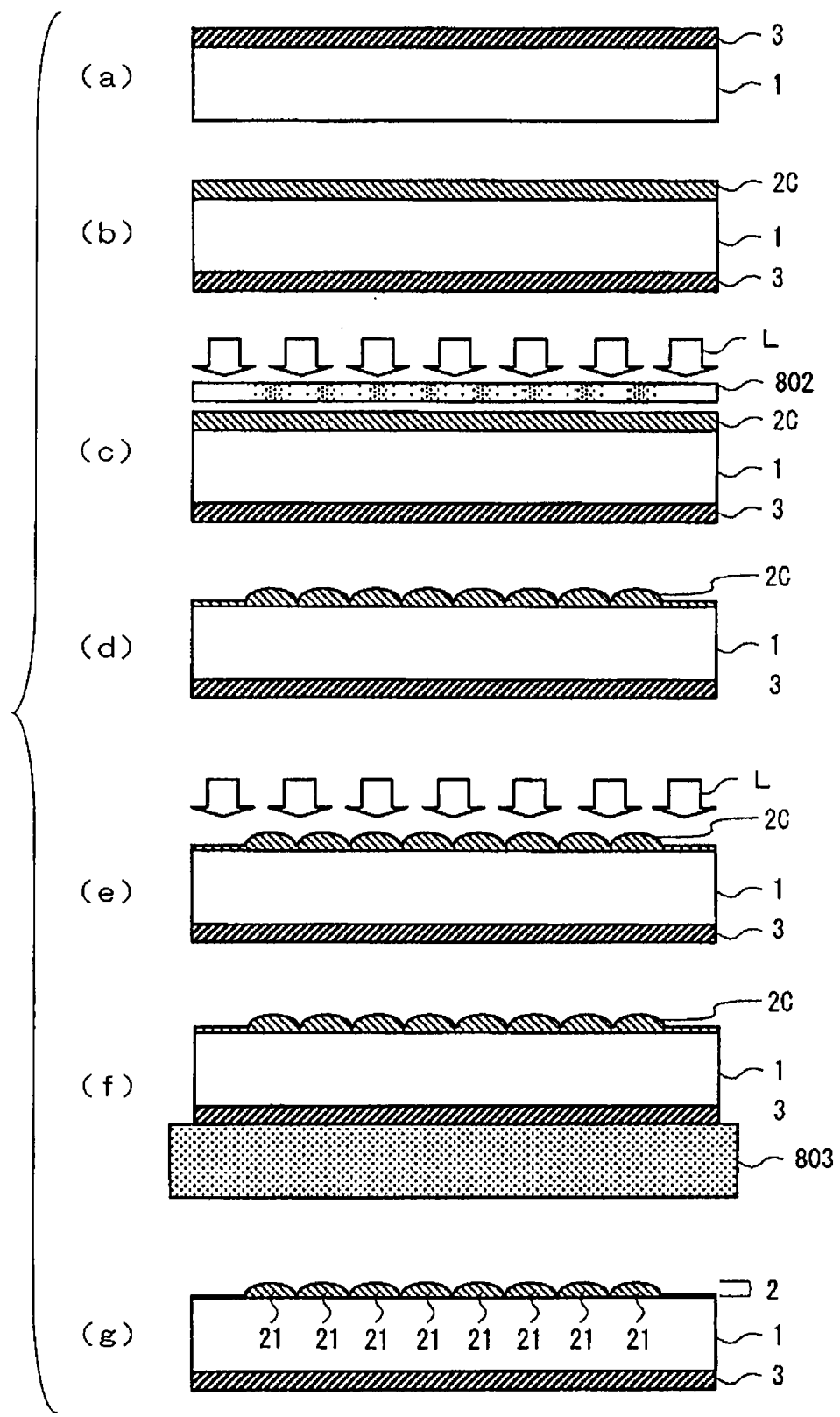
FIG. 7 is an explanatory view illustrating another example of the method for manufacturing the microlens array 10 in the first embodiment of the present invention.

FIG. 7 is an explanatory view illustrating another example of a method for manufacturing the microlens array 10 using a photosoluble resin. The steps illustrated in (c) to (f) of FIG. 7 use a photosoluble resin as a material of the resin layer 2. Therefore, as compared with the steps illustrated in (c) to (f) of FIG. 4, the steps differ in the point of using the photomask 802 in which negative/positive are inverted and in the point that a bleaching step ((e) of FIG. 7) is added between the development step ((d) of FIG. 7) and the post-baking step ((f) of FIG. 7). Other points are the same as FIG. 4.

In (c) of FIG. 7, the resin film of the photosoluble resin 2C is irradiated with light L by using a grayscale mask, as the photomask 802, having a predetermined transmitted light intensity distribution designed on the basis of each lens shape of the microlenses 21. In the case of this example, for example, a grayscale mask having a transmitted light intensity distribution controlled such that transmittance is decreased in a region in which a residual portion in the development step is desired to be increased, such as a position corresponding to a vicinity of a top of a lens, and transmittance is increased in a region in which a residual portion in the development step is desired to be decreased, such as a position corresponding to a space between a lens and a lens, is used.

Thereafter, the photosoluble resin 2C solubilized in an exposed portion of the resin film is dissolved and selectively removed by development, thereby achieving the state where patterns having a cross-sectional shape of a convex spherical surface shape of the residual portion of the resin dissolved (hereinafter, each pattern is called pattern 2C) are formed at the positions on which the microlenses 21 are desired to be formed, on the transparent substrate 1 ((d) of FIG. 7). Even in the present example, each pattern 2C having a spherical surface shape can be formed without any space by controlling the transmitted light intensity distribution of the photomask.

After obtaining the resin layer 2 having the pattern 2C of a spherical surface shape as above, the entire surface of the surface on which each pattern 2C is formed is again exposed ((e) of FIG. 7), followed by conducting post-baking ((f) of FIG. 7). The subsequent steps are the same as the steps illustrated in (f) of FIG. 3 and the subsequent.

Figure 8:
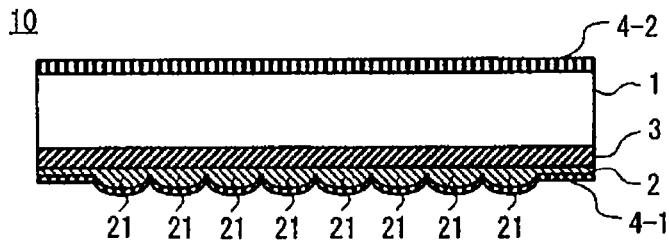
FIG. 8 is a cross-sectional view schematically illustrating another example of the microlens array 10 in the first embodiment of the present invention.

FIGS. 8 to 11 are cross-sectional views schematically illustrating other examples of the microlens array 10 of the present embodiment. As illustrated in FIG. 8, the microlens array 10 of the present embodiment may have a constitution that the light reflection film 3 and the resin layer 2 are stacked in this order on one surface of the transparent substrate 1. Even in this constitution, the time required for curing or solubilizing can be shortened by providing an exposure equipment at a position that the back surface side of the side having a microlens array structure of the resin layer 2 is the light reflection film 3.

In the case of the constitution illustrated in FIG. 8, a material having absorption characteristics to an ultraviolet wavelength region can be used as the material of the transparent substrate 1. In the case of providing the light reflection film 3 between the transparent substrate 1 and the resin layer 2, it is more preferred that the antireflection film 4 (more specifically, an antireflection film 4-2) is provided not only on the resin layer 2, but on the other surface of the transparent substrate 1 as illustrated in FIG. 8.

Figure 9:
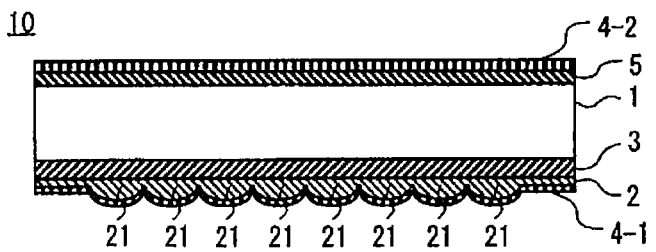
FIG. 9 is a cross-sectional view schematically illustrating another example of the microlens array 10 in the first embodiment of the present invention.

Furthermore, as illustrated in FIG. 9, the microlens array 10 of the present embodiment may be equipped with an infrared light absorption film 5 between the transparent substrate 1 and the antireflection film 4 (more specifically, the antireflection film 4-2). The infrared light absorption film 5 may be provided between the transparent substrate 1 and the light reflection film 3.

The infrared light absorption film 5 is constituted of, for example, a transparent resin containing an infrared ray absorber that absorbs light of an infrared wavelength region. The transparent resin may be any resin so long as it transmits light of a visible wavelength region, and examples thereof include an acrylic resin, a styrene resin, an ABS resin, an AS resin, a polycarbonate resin, a polyolefin resin, a polyvinyl chloride resin, an acetate-based resin, a cellulose-based resin, a polyester resin, an allyl ester resin, a polyimide resin, a polyamide resin, a polyimide ether resin, a polyamide imide resin, an epoxy resin, an urethane resin, a urea resin, and the like.

Examples of the infrared ray absorber that absorbs light of an infrared wavelength region include inorganic fine particles such as ITO ($In_2O_3$—$TiO_2$ type), ATO (ZnO—$TiO_2$ type) and lanthanum borate, and organic dyes such as a cyanine-based compound, a phthalocyanine-based compound, a naphthalocyanine-based compound, a dithiol-metal complex-based compound, a diimmonium-based compound, a polymethine-based compound, a phthalide compound, a naphthoquinone-based compound, an anthraquinone-based compound and an indophenol-based compound.

Other than the above, inorganic fine particles containing crystallites of an oxide containing at least Cu and/or P and having a number average agglomerate diameter of from 5 to 200 nm, and preferably containing crystallites of a compound represented by the following formula (1) and having a number average agglomerate diameter of from 5 to 200 nm, can be used.

$$Al_{1/n}CuPO_4 \qquad \text{formula (1)}$$

(in the formula, A is at least one kind selected from the group consisting of an alkali metal (Li, Na, K, Rb and Cs), an alkaline earth metal (Mg, Ca, Sr and Ba), and $NH_4$, and a subscript n is 1 when A is an alkali metal or $NH_4$, and is 2 when A is an alkaline earth metal).

The inorganic fine particles containing such crystallites are preferred in that they can maintain infrared ray absorption characteristics due to a crystal structure, and furthermore, the crystallites can be contained in the infrared light absorption film 5 in high concentration because they are fine particles, and absorbing power per unit length can be increased.

The inorganic fine particles may be subjected to a surface treatment by the conventional method for the purpose of improving weather resistance, acid resistance, water resistance and the like, and improving compatibility with a binder resin by surface modification.

The organic dyes are preferably dyes that suppress transmittance of a near infrared wavelength region in a wide range, and the compounds described above are exemplified. It is preferred to contain a near infrared absorption dye (A1) having an action in a near infrared ray absorption layer, of giving a high transmittance in a visible wavelength band of from 450 to 600 nm and a low transmittance (light shielding) in a near infrared wavelength band of from 695 to 720 nm, and making their interface region steep. More preferred is a near infrared absorption dye in which λmax in a maximum absorption peak of its absorption spectrum is present in a region of from 695 to 720 nm and the full width at half maximum in the maximum absorption peak of the absorption spectrum is 60 nm or less.

Furthermore, it is preferred as the near infrared absorption dye (A1) that its absorption spectrum does not have any other absorption peak having a sharp shape of the full width at half maximum being 100 nm or less other than the maximum absorption peak, in addition to that the absorption spectrum has the characteristics described above. As a specific near infrared absorption dye (A1), a squarylium-based compound is particularly excellent, and is preferred in that its light absorption characteristic matches with an optical characteristic that absorbance steeply changes in a range of a wavelength of from about 630 to 700 nm as required in a near infrared ray cut filter, and additionally storage stability and stability to light can be secured. In the case of using this dye, a transparent resin having a refractive index of 1.54 or more at a wavelength of 589 nm is preferably used as the transparent resin.

The infrared ray absorbers may be used in one kind alone, and may be used by mixing two kinds or more.

The content of the infrared ray absorber in the infrared light absorption film 5 is, for example, preferably from 20 to 60 mass %, and more preferably from 20 to 50 mass %, in the case of the inorganic fine particles containing crystallites of an oxide containing at least Cu and/or P as described above. Furthermore, in the case of the near infrared absorption dye (A1) described above, the content is preferably from 0.05 to 5 mass %, and more preferably from 0.5 to 3 mass %. Where the content of each infrared ray absorber is less than those ranges, there is a possibility that light of a infrared wavelength region cannot be sufficiently absorbed, and where the content exceeds the ranges, there is a possibility that transmittance of light of a visible wavelength region is decreased.

In addition to the infrared ray absorber, the transparent resin constituting the infrared light absorption film 5 may further contain a color tone correcting dye, a leveling agent, an antistatic agent, a thermal stabilizer, an antioxidant, a dispersant, a flame retardant, a lubricant, a plasticizer and the like in a range that does not impair the advantageous effects of the present invention.

The infrared light absorption film 5 can be formed by, for example, dispersing or dissolving a transparent resin, an infrared ray absorber, and other additives blended as necessary in a dispersion medium or a solvent to prepare a coating liquid, applying the coating liquid to the desired surface of the transparent substrate 1, and drying. The application and drying can be carried out by dividing those into multiple operations. Furthermore, a plurality of coating liquids having different constituent components may be prepared, and those may be successively applied and dried. Specifically, for example, a coating liquid containing inorganic fine particles containing crystallites of an oxide containing at least Cu and/or P described above, and a coating liquid containing ITO particles may be separately prepared, and those may be successively applied and dried.

Examples of the dispersion medium or solvent include water, an alcohol, a ketone, an ether, an ester, an aldehyde, an amine, an aliphatic hydrocarbon, an alicyclic hydrocarbon, and an aromatic hydrocarbon. Those may be used in one kind alone and may be used by mixing two kinds or more. The coating liquid may contain a dispersant as necessary. Examples of the dispersant that can be used include a surfactant, a silane compound, a silicone resin, a titanate-based coupling agent, an aluminum-based coupling agent and a zircoaluminate-based coupling agent.

A stirring apparatus such as a rotation/revolution mixer, a bead mill, a planet mill or an ultrasonic homogenizer can be used in the preparation of the coating liquid. To secure high transparency, it is preferred to sufficiently conduct stirring. The stirring may be conducted continuously, and may be conducted intermittently.

For the application of the coating liquid, a spin coating method, a bar coating method, a dip coating method, a casting method, a spray coating method, a bead coating method, a wire bar coating method, a blade coating method, a roller coating method, a curtain coating method, a slit die coating method, a gravure coating method, a slit reverse coating method, a microgravure method, a comma coating method and the like can be used.

The thickness of the infrared light absorption film 5 is preferably a range of from 0.01 to 200 μm, and more preferably from 0.1 to 50 μm. When the thickness is less than 0.01 μm, there is a possibility that desired absorbing power is not obtained, and when the thickness exceeds 200 μm, there is a possibility that uneven drying occurs when drying.

Thus, by providing the infrared light absorption film 5, good near infrared ray cut function can be imparted to the microlens array 10.

Figure 10:
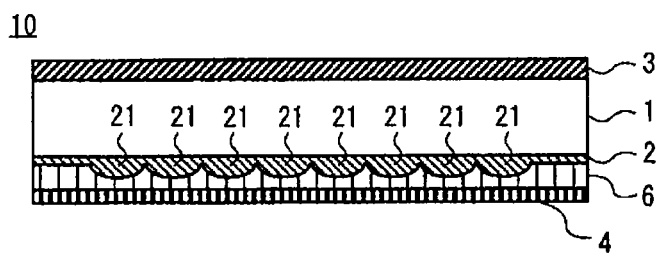
FIG. 10 is a cross-sectional view schematically illustrating another example of the microlens array 10 in the first embodiment of the present invention.

Furthermore, as illustrated in FIG. 10, the microlens array 10 of the present embodiment may have a constitution that a cover layer 6 is provided on the surface having a microlens array structure formed thereon, of the resin layer 2. The cover layer 6 may be formed on at least a range that covers a region having microlenses formed thereon. The cover layer 6 can be formed by, for example, using a resin.

By providing the cover layer 6, the microlens array structure can be protected. Furthermore, by providing the cover layer 6, a control range of a focal distance can be widened. An exemplified method is that the cover layer 6 is provided, for example, in the case where a curvature radius cannot be increased but a focal distance is desired to be increased. That is, in the case where a focal distance is desired to be increased, it is necessary to decrease a height of a lens (increase a curvature radius). However, in the case where a height of a lens cannot be physically decreased, it is possible to equivalently decrease a height of a lens by decreasing a difference in refractive index between the lens and the cover layer. Furthermore, by switching a magnitude relation of refractive index of the lens and the cover layer, a degree of freedom of processing the microlenses can be improved such that a microlens prepared in a convex lens shape is functioned as a concave lens, or a microlens prepared in a concave lens shape is functioned as a convex lens, which is preferred. As illustrated in FIG. 10, the antireflection film 4 may be further provided on the cover layer 6.

Figure 11:
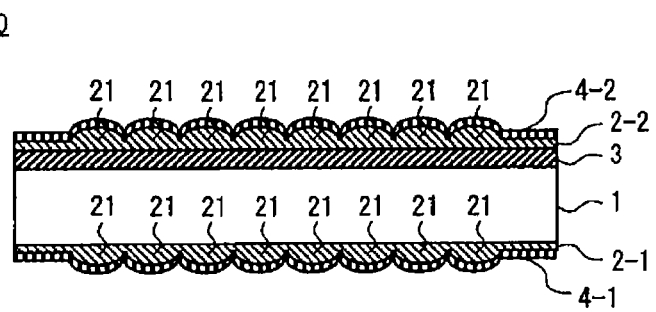
FIG. 11 is a cross-sectional view schematically illustrating another example of the microlens array 10 in the first embodiment of the present invention.

The examples in which the resin layer 2 having a microlens array structure is provided on only one surface of the transparent substrate 1 are described above, but it is also possible to provide the resin layers 2 (more specifically, resin layers 2-1 and 2-2) each having a microlens array structure on both surfaces of the transparent substrate 1 as illustrated in FIG. 11. In this case, the constitution may be that the light reflection film 3 is provided between any of the resin layers 2 and the transparent substrate 1. The light reflection film 3 is formed prior to the resin layers 2-1 and 2-2. Furthermore, it is possible to provide the antireflection film 4 (more specifically, antireflection films 4-1 and 4-2) to the respective resin layers 2. Furthermore, although not illustrated, it is possible to provide the cover layer 6 and the antireflection film 4 to the respective resin layers 2.

Second Embodiment

Figure 12:
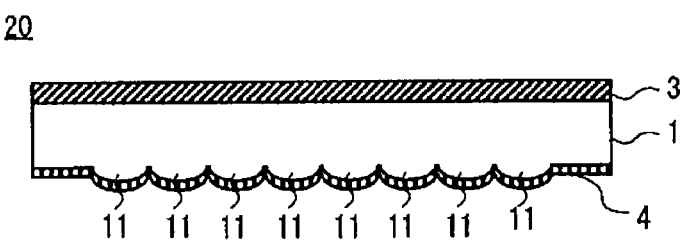
FIG. 12 is a cross-sectional view schematically illustrating a microlens array 20 according to a second embodiment of the present invention.

FIG. 12 is a cross-sectional view schematically illustrating a microlens array 20 according to the second embodiment of the present invention. In this and subsequent embodiments, in order to avoid overlapping explanation, explanations of the points common to the first embodiment are omitted, and different points are mainly explained.

In the microlens array 20 of the present embodiment, a microlens array structure is directly formed on the surface of the transparent substrate 1, not on the resin layer 2, as illustrated in FIG. 12. Each microlens directly formed on the surface of the transparent substrate 1 is hereinafter called a microlens 11.

Figure 13:
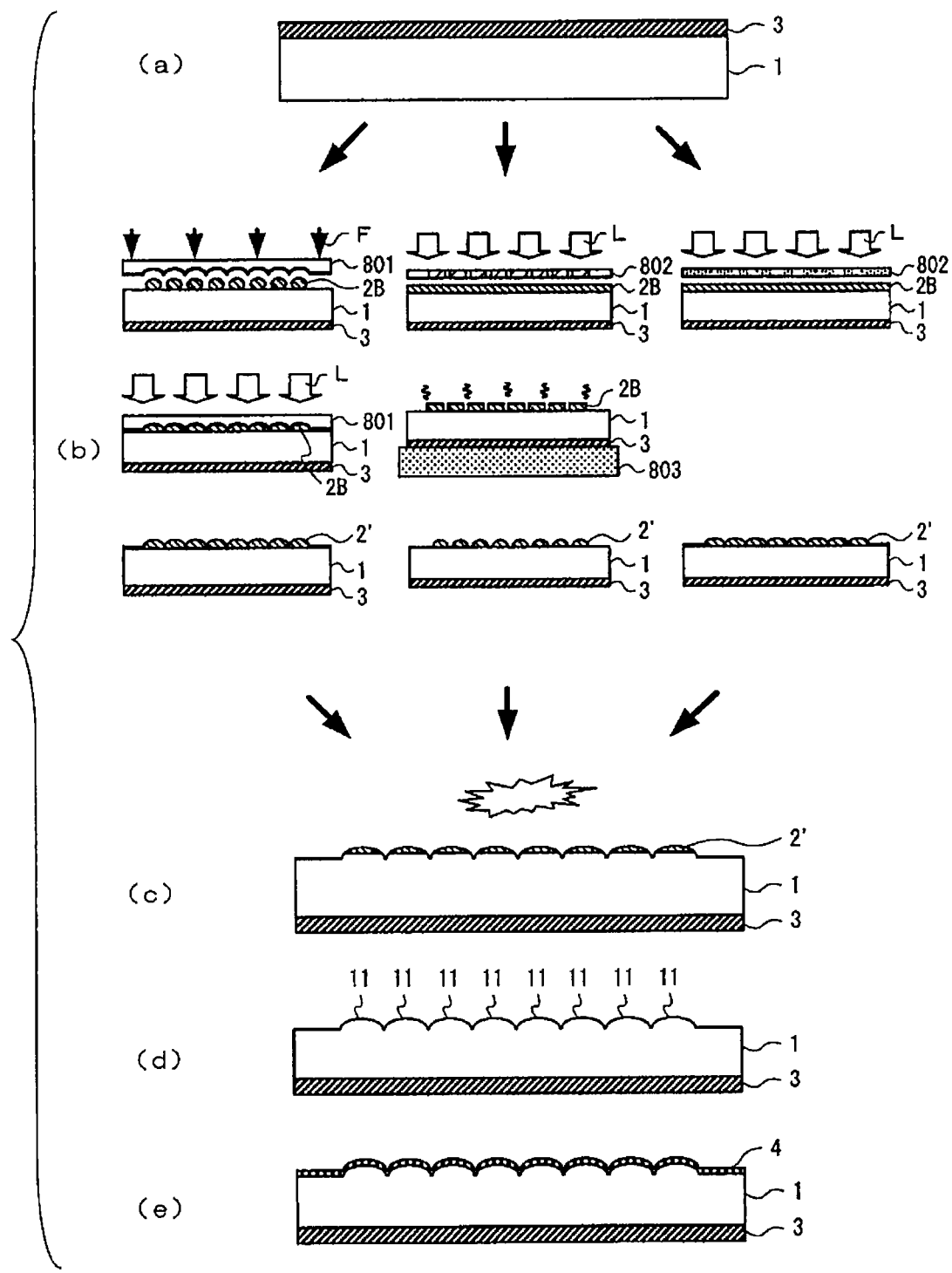
FIG. 13 is an explanatory view illustrating one example of a method for manufacturing the microlens array 20 in the second embodiment of the present invention.
Figure 14:
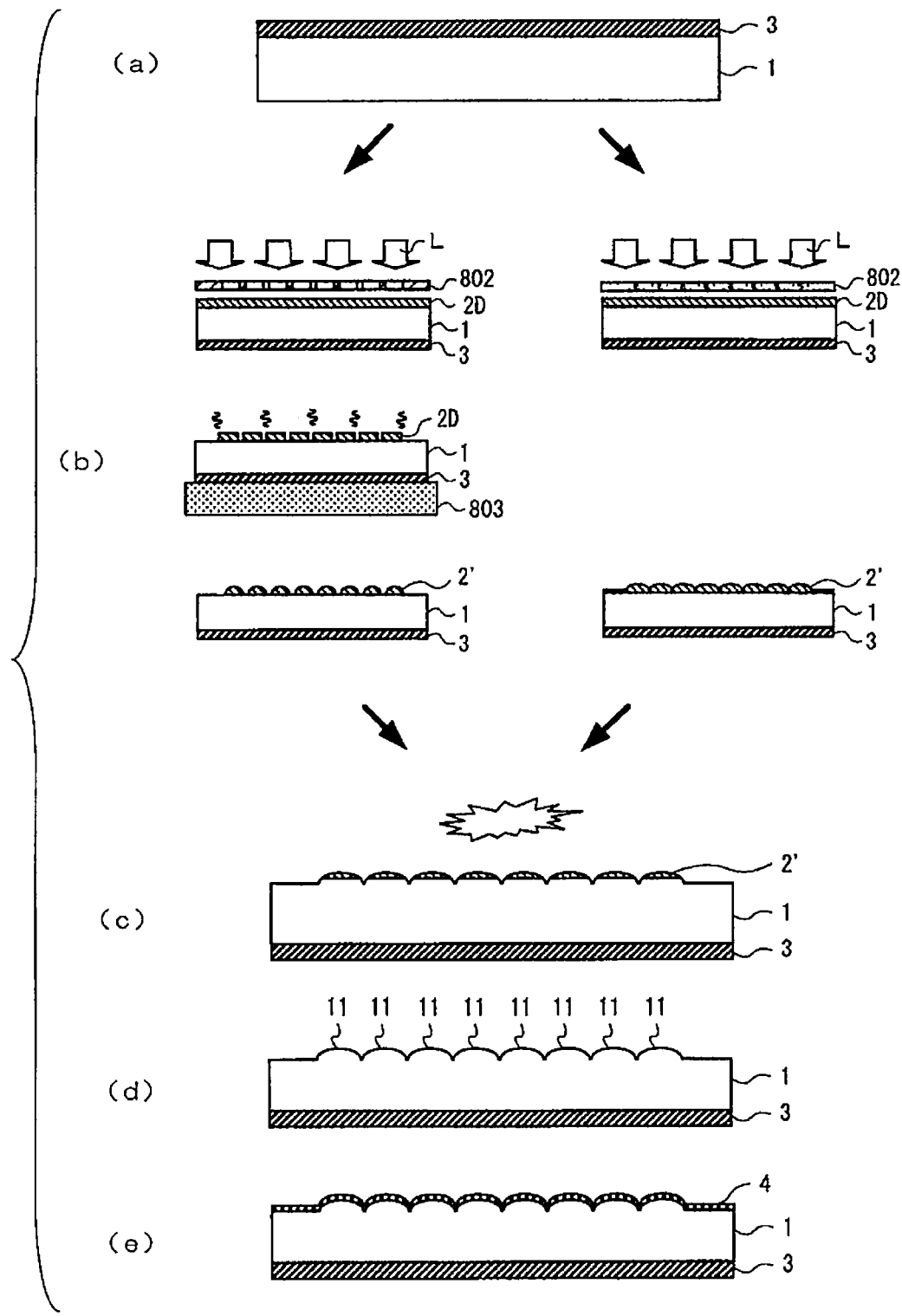
FIG. 14 is an explanatory view illustrating another example of the method for manufacturing the microlens array 20 in the second embodiment of the present invention.

A method for manufacturing the microlens array 20 of the present embodiment is described below. FIG. 13 and FIG. 14 are explanatory views each illustrating one example of the method for manufacturing the microlens array 20 of the present embodiment. FIG. 14 is the same except that the formation step of a resin layer 2' illustrated in (b) of FIG. 14 differs from that illustrated in (b) of FIG. 13 due to the difference in a material used. Therefore, the method for manufacturing the microlens array 20 of the present embodiment is mainly described below by reference to FIG. 13.

Even in the example illustrated in FIG. 13, the light reflection film 3 is first formed on one entire surface of the transparent substrate 1 ((a) of FIG. 13). For example, a dielectric multilayer film that reflects light of an ultraviolet wavelength region (for example, the whole or a part of light having a wavelength of from 200 to 400 nm) may be formed as the light reflection film 3.

Next, the resin layer 2' having the same shape as a microlens array structure is formed by using the same method as in the first embodiment ((b) of FIG. 13). In the present embodiment, a photosensitive resin that cures or solubilizes by reacting to light, such as a photocurable resin 2B or a photosoluble resin 2D, is used as an imprint material or a photolithography material. Any photosensitive resin can be used without particular limitation so long as it has photocurability or photosolubilizability. For example, a photosensitive acrylic monomer may be used. The photocurable resin 2A and photosoluble resin 2C used in the first embodiment become a lens material, and are therefore required to have light transmitting property. However, the photocurable resin 2B and photosoluble resin 2D used in the present embodiment are a material of a photoresist used for transferring a microlens shape to a transparent substrate, that is, a material of a mask for etching, and therefore are not required to have light transmitting property. The photocurable resin 2B and the photosoluble resin 2D as a photoresist material are hereinafter referred as a resist material 2B and a resist material 2D, respectively.

As for the formation of the resin layer 2', in the case of using the resist material 2B, for example, a formation method by a mold as illustrated in (b) to (f) of FIG. 2, a formation method by a photomask and thermal reflow as illustrated in (b) to (f) of FIG. 3, or a formation method by a grayscale photomask as illustrated in (b) to (f) of FIG. 4 may be used. In the case of using the resist material 2D, for example, a formation method by a photomask and thermal reflow as illustrated in (b) to (g) of FIG. 6 or a formation method by a grayscale photomask as illustrated in (b) to (g) of FIG. 7 may be used. In the present embodiment, the resin layer 2' is used as a mask. Therefore, the bleaching step that is a process for increasing transmittance as illustrated in (e) of FIG. 6 or (e) of FIG. 7 may be omitted (see (b) of FIG. 13 and (b) of FIG. 14).

After obtaining the resin layer 2' having the same shape as the microlens array structure, that is, as a plurality of microlenses 11 arranged in an array shape, on the transparent substrate 1, dry etching of the transparent substrate 1 is conducted utilizing the resin layer 2' as a mask ((c) of FIG. 13) to transfer a surface shape of the resin layer 2' to the surface of the transparent substrate 1. By this procedure, the microlens structure, that is, a plurality of microlenses 11 arranged in an array shape, is formed on the surface of the transparent substrate 1 ((d) of FIG. 13).

Finally, the antireflection film 4 is formed on the surface of the transparent substrate 1 at the side having the microlens array structure formed thereon ((e) of FIG. 13).

Figure 15:
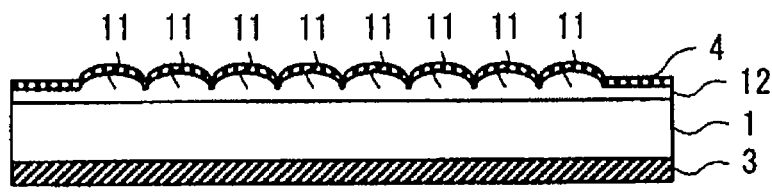
FIG. 15 is a cross-sectional view schematically illustrating another example of the microlens array 20 in the second embodiment of the present invention.

In the case where the transparent substrate is a material which is difficult to etch, a microlens array may be formed by stacking a material that is easy to etch on a transparent substrate to form an etching layer, and conducting the same processing to the etching layer. Examples of the material that is easy to etch include $SiO_2$ and $Ta_2O_5$. The etching layer can be formed on a transparent substrate by sputtering, CVD, vapor deposition or the like of those materials. FIG. 15 is an example of the microlens array 20 in the case of stacking the etching layer 11 on the transparent substrate 1. In the case of this example, in the relationship to other member (for example, the light reflection film 3 or the like), the transparent substrate 1 is treated as including the etching layer 12.

Thus, even in the microlens array 20 of the present embodiment, in order to form the resin layer 2' used as a photoresist when transferring a shape of each microlens 11 to the transparent substrate 1 in the manufacturing step, each member is constituted such that exposure is conducted to the resist material 2B or the resist material 2D in the state that the light reflection film 3 is formed at the back surface side from an exposure equipment, and as a result, the time required for curing or solubilizing can be shortened. Therefore, the resin layer 2' can be formed in a short period of time, and as a result, productivity of the microlens array 20 can be improved. Regarding other points, those are the same as in the first embodiment. A curvature radius of a spherical surface can be optionally adjusted by controlling a selection ratio (ratio of etching rates) between the transparent substrate 1 and the resin layer 2' in the etching step. Therefore, it is not always necessary to prepare the resin layer 2' in the same shape as in the microlens array structure. For example, a curvature radius of the resin layer 2' may be adjusted in conformity with a usable selection ratio depending on a gas, a glass material, a mask material and apparatus etching conditions used.

Figure 16:
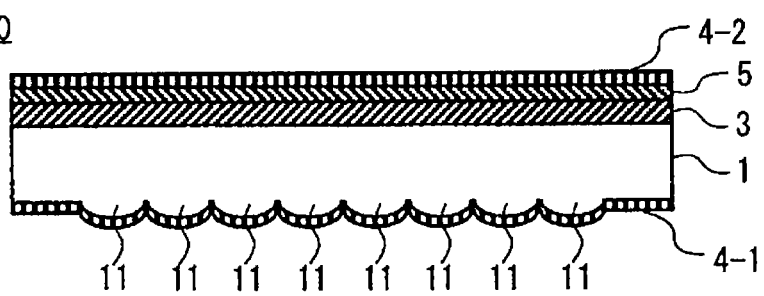
FIG. 16 is a cross-sectional view schematically illustrating another example of the microlens array 20 in the second embodiment of the present invention.
Figure 17:
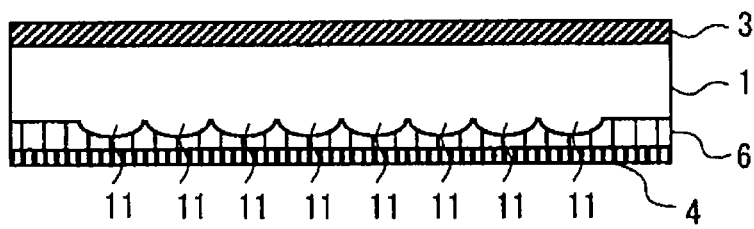
FIG. 17 is a cross-sectional view schematically illustrating another example of the microlens array 20 in the second embodiment of the present invention.
Figure 18:
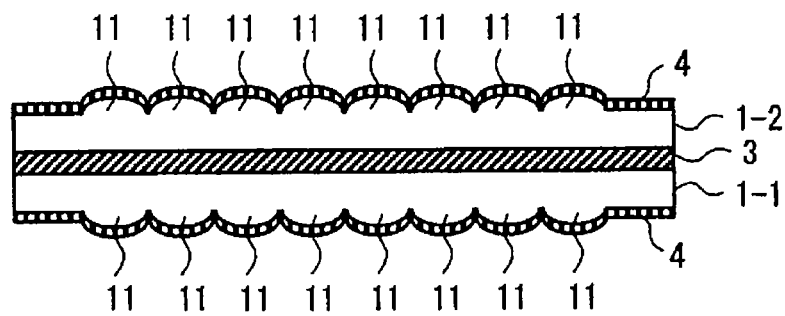
FIG. 18 is a cross-sectional view schematically illustrating another example of the microlens array 20 in the second embodiment of the present invention.

FIGS. 16 to 18 are cross-sectional views schematically illustrating other examples of the microlens array 20 of the present embodiment. As illustrated in FIG. 16, even in the microlens array 20 of the present embodiment, the infrared light absorption film 5 may be provided between the light reflection film 3 and the antireflection film 4 (more specifically, antireflection film 4-2) or between the transparent substrate 1 and the light reflection film 3.

Furthermore, as illustrated in FIG. 17, the microlens array 20 of the present embodiment may also have a constitution that the cover layer 6 is provided on the surface having a microlens array structure formed thereon of the transparent substrate 1.

Furthermore, as illustrated in FIG. 18, even in the present embodiment, a microlens array structure can be provided on both surfaces of an element. For example, after forming a transparent substrate 1-1 having a microlens array structure on one surface thereof by using the method illustrated in FIG. 13, the light reflection film 3 and another transparent substrate 1-2 are adhered by using an adhesive or the like, and a microlens array structure is formed on the surface of the transparent substrate 1-2 at a side on which the light reflection film 3 is not formed, again by using the same method.

Third Embodiment

An image pickup element package in which a microlens array and an image pickup element substrate are integrated is described in this embodiment. An example in which the microlens array 10 illustrated in FIG. 1 and an image pickup element substrate are integrated is described below, but the microlens array may be any one of the microlens arrays described hereinabove.

Figure 19:
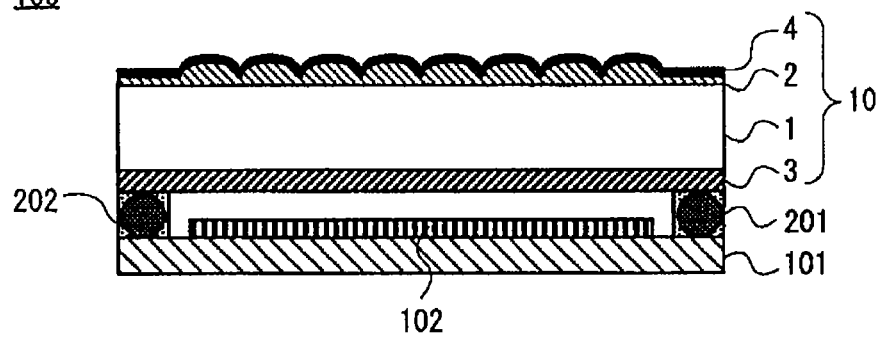
FIG. 19 is a cross-sectional view schematically illustrating an example of an image pickup element package 100 according to the present invention.

FIGS. 19 to 23 are cross-sectional views schematically illustrating examples of an image pickup element package 100 or an image pickup device 200 according to the present invention. As illustrated in FIG. 19, the image pickup element package 100 according to the present invention may be one in which an image pickup element substrate 101 having a light receiving element array 102 formed thereon corresponding to a given pixel pitch and the microlens array 10 are directly adhered by using an adhesive 202 containing a gap spacer 201.

As the adhesive 202, for example, epoxy-based thermosetting-type or photosetting-type resin can be used. Other than those, an acrylic or silicon-based thermosetting-type or photosetting-type resin may be used.

Thus, the function of an ultraviolet ray cut filter to an image pickup element can be effectively developed by integrating the microlens array 10 equipped with the light reflection film 3 and an image pickup element substrate. Furthermore, in the case where the microlens array 10 is equipped with a member that absorbs or reflects light of an infrared region, the function of a near infrared cut filter to an image pickup element can be effectively developed.

Figure 20:
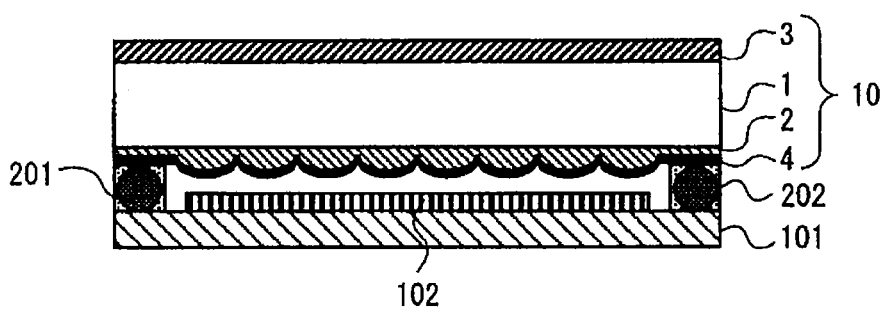
FIG. 20 is a cross-sectional view schematically illustrating an example of the image pickup element package 100 according to the present invention.

An example of adhering such that a lens surface becomes the surface (incident side) is illustrated in FIG. 19, but as illustrated in FIG. 20, it is possible to adhere with the image pickup element substrate 101 such that a lens surface is the back. Furthermore, it is more preferred to combine a microlens array having microlens array structures provided on both surface thereof, from the standpoint that an aberration can be suppressed.

Figure 21:
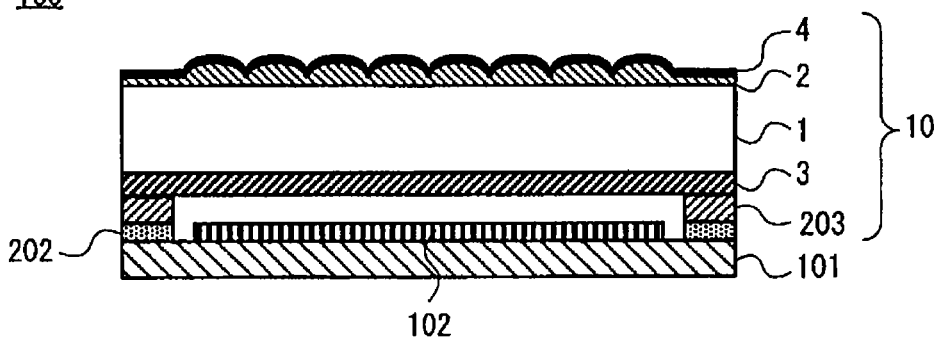
FIG. 21 is a cross-sectional view schematically illustrating an example of the image pickup element package 100 according to the present invention.

Furthermore, as illustrated in FIG. 21, in place of using the gap spacer 201, a resist 203 having been subjected to photolithography may be formed on an outer periphery of the surface below a microlens array to form a desired height, and the resist 203 and the image pickup element substrate 101 may be adhered by the adhesive 202. Even in a step of forming the resist 203, in the case of using a photocurable resin or a photosoluble resin as a resist material, the effect of shortening a curing time or a solubilizing time by the light reflection film 3 can be obtained.

Figure 22:
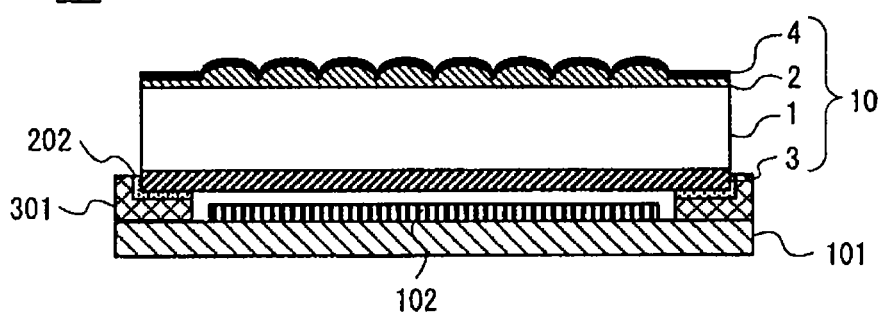
FIG. 22 is a cross-sectional view schematically illustrating an example of the image pickup element package 100 according to the present invention.

Furthermore, as illustrated in FIG. 22, in the case of the constitution that the image pickup element substrate 101 is stored in a housing 301, to its opening may be adhered an outer periphery of the microlens array 10 by the adhesive 202 to form one package component.

Figure 23:
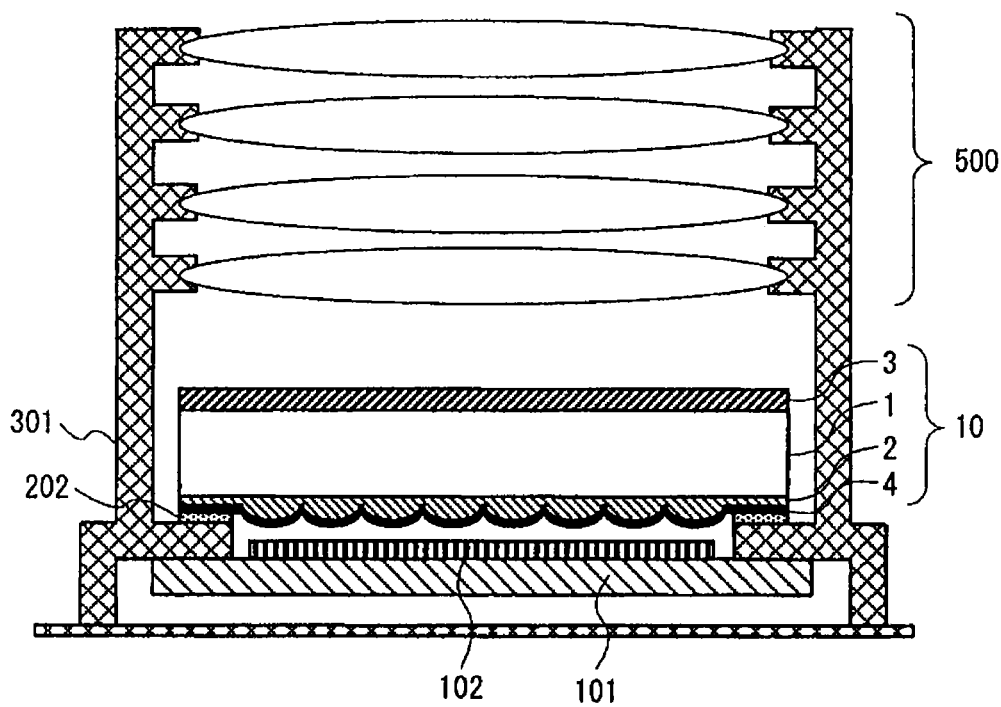
FIG. 23 is a cross-sectional view schematically illustrating an example of an image pickup device 200 according to the present invention.

Furthermore, as illustrated in FIG. 23, the housing 301 may be one that holds and fixes the image pickup element substrate 101, the microlens array 10 and lenses 500. Furthermore, the housing 301 may be one that constitutes an image pickup device 200.

In the example illustrated in FIG. 23, the image pickup element substrate 101, the microlens array 10 and the lenses 500 are arranged along an optical axis, and the microlens array 10 is arranged between the image pickup element substrate 101 and the lenses 500. Individual image pickup elements are arranged in an array shape on the image pickup element substrate 101 to constitute the image pickup element array 102. The individual image pickup elements are electric components that convert incident light passed through the lenses 500 and the microlens array 10 to an electrical signal and are, for example, CCD or CMOS.

In the image pickup device 200, light incident from an object side passes through the lenses 500 and the microlens array 10 and is incident to the image pickup element array 102. Each image pickup element converts the incident light into an electrical signal, and outputs it as an image signal. The incident light passes through the microlens array 10, and is thus received by the image pickup element array 102 as light in which ultraviolet ray and near infrared ray have been sufficiently shielded.

In an optical device using a microlens array and an pixel array of an image pickup element in combination, when coefficient of thermal expansion is controlled to match between the transparent substrate 1 of the microlens array and an image pickup element substrate to which the transparent substrate 1 is to be adhered or a housing having an image pickup element stored therein, deviation of a light-concentrating spot due to position deviation between a microlens array and a pixel array of an image pickup element during rising a temperature can be prevented.

Furthermore, when a glass having small amount of an α-ray emission is used as a material of the transparent substrate 1 of a microlens array, noise generation due to an α-ray in an image pickup element and damage of an image pickup element can be prevented.

EXAMPLES

The microlens array and the image pickup element package equipped with the microlens array as an integrated package according to the present invention are described using specific examples.

Example 1

This example is one example of a microlens array 10 having the constitution illustrated in FIG. 1. A silica ($SiO_2$;

refractive index: 1.45 (wavelength: 550 nm)) layer and a titania (TiO$_2$; refractive index: 2.32 (wavelength: 550 nm)) layer are alternately stacked on one surface of a transparent substrate 1 that is a rectangular plate-shaped infrared ray absorption glass of 40 mm×40 mm×0.3 mm (NF-50 glass, manufactured by Asahi Glass Co., Ltd.) by a vacuum deposition method to form a light reflection film 3 of a dielectric multilayer film (34 layers) consisting of the constitution shown in Table 1 below.

TABLE 1

| | Material | Physical film thickness (nm) |
|---|---|---|
| 1st layer | TiO$_2$ | 13.65 |
| 2nd layer | SiO$_2$ | 33.09 |
| 3rd layer | TiO$_2$ | 113.88 |
| 4th layer | SiO$_2$ | 171.51 |
| 5th layer | TiO$_2$ | 108.51 |
| 6th layer | SiO$_2$ | 176.41 |
| 7th layer | TiO$_2$ | 110.96 |
| 8th layer | SiO$_2$ | 176.88 |
| 9th layer | TiO$_2$ | 110.06 |
| 10th layer | SiO$_2$ | 176.77 |
| 11th layer | TiO$_2$ | 111.64 |
| 12th layer | SiO$_2$ | 176.33 |
| 13th layer | TiO$_2$ | 110.14 |
| 14th layer | SiO$_2$ | 176.63 |
| 15th layer | TiO$_2$ | 108.76 |
| 16th layer | SiO$_2$ | 174.28 |
| 17th layer | TiO$_2$ | 103.25 |
| 18th layer | SiO$_2$ | 158.13 |
| 19th layer | TiO$_2$ | 88.1 |
| 20th layer | SiO$_2$ | 147.6 |
| 21st layer | TiO$_2$ | 84.86 |
| 22nd layer | SiO$_2$ | 140.42 |
| 23rd layer | TiO$_2$ | 834 |
| 24th layer | SiO$_2$ | 137.79 |
| 25th layer | TiO$_2$ | 83.18 |
| 26th layer | SiO$_2$ | 137.18 |
| 27th layer | TiO$_2$ | 82.4 |
| 28th layer | SiO$_2$ | 139.9 |
| 29th layer | TiO$_2$ | 82.51 |
| 30th layer | SiO$_2$ | 140.73 |
| 31st layer | TiO$_2$ | 83.62 |
| 32nd layer | SiO$_2$ | 147.28 |
| 33rd layer | TiO$_2$ | 85.56 |
| 34th layer | SiO$_2$ | 67.83 |

Next, a photocurable resin 2A that is a material of a resin layer 2 (more specifically, a microlens array structure) is spin-coated at 1,300 rpm as a photolithography material on the other surface of the transparent substrate 1 having the light reflection film 3 formed thereon, and heated at 100° C. to form a resin film having a film thickness of 1.7 µm. Here, an ultraviolet ray curable acrylate-based resin having a refractive index of 1.52 is used as a photocurable resin.

Next, the resin film obtained of the photocurable resin 2A is irradiated with ultraviolet rays of 100 mJ/cm$^2$ by a high pressure mercury lamp in the state of interposing a photomask in which positions corresponding to microlenses 21 have been opened to cure the resin film. Thereafter, an unexposed portion is removed by using a 0.04 mass % potassium hydroxide aqueous solution. As a result, a pattern 2A in which columns having a diameter of 31 µm and a height of 1.7 µm of a photocured resin are arranged with 32 µm pitch is obtained on the transparent substrate 1.

The columnar pattern 2A obtained is then heated at 200° C. and melted to form convex spherical surface-shaped microlenses 21 having a curvature radius of 62.4 µm. As a result, the resin layer 2 having the microlenses 21 arranged side by side with 32 µm pitch is obtained on the transparent substrate that is an infrared ray absorption glass.

Next, a three-layered antireflection layer 4 consisting of the constitution as shown in Table 2 below is formed on the resin layer 2.

TABLE 2

| | Material | Refractive index* | Physical film thickness (nm) |
|---|---|---|---|
| 1st layer | Al$_2$O$_3$ | 1.65 | 83.33 |
| 2nd layer | ZrO$_2$ | 2.05 | 134.15 |
| 3rd layer | MgF$_2$ | 1.38 | 99.64 |

*Wavelength: 550 nm

Figure 25:
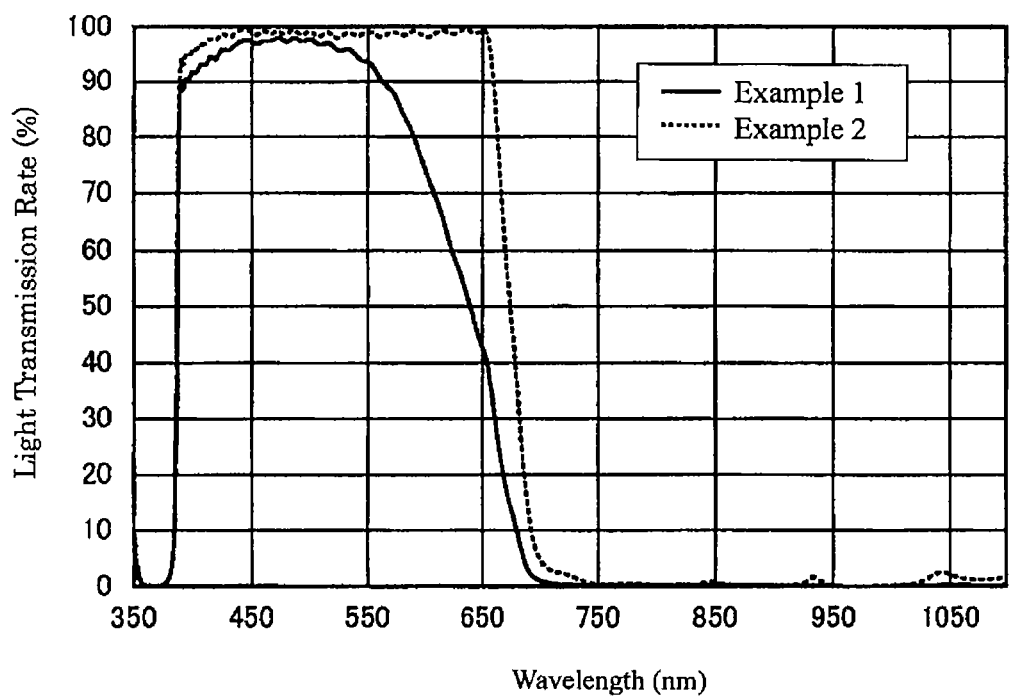
FIG. 25 is a view showing spectral transmittance curves of the microlens array 10 in Examples 1 and 2 of the present invention.

The resin layer 2 of the microlens array 10 thus prepared is sufficiently cured. Spectral transmittance curve (incident angle: 0°) of the microlens array 10 obtained is collectively shown in FIG. 25.

Comparative Example 1

When a microlens array is produced in the same manner as in Example 1, except that a light reflection film 3 of a dielectric multilayer film is not formed and a resin layer 2 is formed on one surface of an infrared ray absorption glass (NF-50 glass), a photocurable resin 2A used as a resist material cannot be sufficiently cured by the irradiation with ultraviolet rays of 100 mJ/cm$^2$.

Example 2

A microlens array 10 is manufactured in the same manner as in Example 1, except that a soda glass plate having a thickness of 0.3 mm is used in place of the infrared ray absorption glass (NF-50 glass).

The resin layer 2 formed is sufficiently cured. Spectral transmittance curve (incident angle: 0°) of the near infrared ray cut filter obtained is collectively shown in FIG. 25.

Example 3

This example is one example of a microlens array 10 having the constitution illustrated in FIG. 9. In this example, an infrared light absorption film 5 having a thickness of 8 µm is formed on one surface of a rectangular plate-shaped soda glass of 40 mm×40 mm×0.3 mm, and a light reflection layer 3 of a dielectric multilayer film (68 layers) consisting of the constitution shown in Table 3 below is formed on the other surface thereof.

TABLE 3

| | Material | Physical film thickness (nm) |
|---|---|---|
| 1st layer | TiO$_2$ | 14.12 |
| 2nd layer | SiO$_2$ | 36.98 |
| 3rd layer | TiO$_2$ | 123.17 |
| 4th layer | SiO$_2$ | 184.89 |
| 5th layer | TiO$_2$ | 117.52 |
| 6th layer | SiO$_2$ | 189.03 |
| 7th layer | TiO$_2$ | 119.1 |
| 8th layer | SiO$_2$ | 191.04 |
| 9th layer | TiO$_2$ | 119.95 |
| 10th layer | SiO$_2$ | 190.39 |
| 11th layer | TiO$_2$ | 121.39 |
| 12th layer | SiO$_2$ | 193.44 |
| 13th layer | TiO$_2$ | 121.93 |
| 14th layer | SiO$_2$ | 193.28 |
| 15th layer | TiO$_2$ | 122.86 |
| 16th layer | SiO$_2$ | 193.93 |

TABLE 3-continued

| | Material | Physical film thickness (nm) |
|---|---|---|
| 17th layer | TiO$_2$ | 122.85 |
| 18th layer | SiO$_2$ | 193.67 |
| 19th layer | TiO$_2$ | 122.5 |
| 20th layer | SiO$_2$ | 192.92 |
| 21st layer | TiO$_2$ | 121.86 |
| 22nd layer | SiO$_2$ | 191.44 |
| 23rd layer | TiO$_2$ | 120.08 |
| 24th layer | SiO$_2$ | 186.29 |
| 25th layer | TiO$_2$ | 113.6 |
| 26th layer | SiO$_2$ | 172.97 |
| 27th layer | TiO$_2$ | 103.7 |
| 28th layer | SiO$_2$ | 164.24 |
| 29th layer | TiO$_2$ | 98.85 |
| 30th layer | SiO$_2$ | 161.08 |
| 31st layer | TiO$_2$ | 96.99 |
| 32nd layer | SiO$_2$ | 162.66 |
| 33rd layer | TiO$_2$ | 107.01 |
| 34th layer | SiO$_2$ | 178.29 |
| 35th layer | TiO$_2$ | 112.51 |
| 36th layer | SiO$_2$ | 173.09 |
| 37th layer | TiO$_2$ | 98.13 |
| 38th layer | SiO$_2$ | 154.76 |
| 39th layer | TiO$_2$ | 93.36 |
| 40th layer | SiO$_2$ | 152.12 |
| 41st layer | TiO$_2$ | 89.59 |
| 42nd layer | SiO$_2$ | 149.76 |
| 43rd layer | TiO$_2$ | 89.73 |
| 44th layer | SiO$_2$ | 147.84 |
| 45th layer | TiO$_2$ | 88.43 |
| 46th layer | SiO$_2$ | 147.48 |
| 47th layer | TiO$_2$ | 88.36 |
| 48th layer | SiO$_2$ | 148.04 |
| 49th layer | TiO$_2$ | 88.26 |
| 50th layer | SiO$_2$ | 147.35 |
| 51st layer | TiO$_2$ | 88.51 |
| 52nd layer | SiO$_2$ | 149.1 |
| 53rd layer | TiO$_2$ | 87.72 |
| 54th layer | SiO$_2$ | 148.07 |
| 55th layer | TiO$_2$ | 88.13 |
| 56th layer | SiO$_2$ | 149.31 |
| 57th layer | TiO$_2$ | 88.01 |
| 58th layer | SiO$_2$ | 149.02 |
| 59th layer | TiO$_2$ | 89.3 |
| 60th layer | SiO$_2$ | 148.56 |
| 61st layer | TiO$_2$ | 89.32 |
| 62nd layer | SiO$_2$ | 150.97 |
| 63rd layer | TiO$_2$ | 91.13 |
| 64th layer | SiO$_2$ | 150.96 |
| 65th layer | TiO$_2$ | 94.47 |
| 66th layer | SiO$_2$ | 158.34 |
| 67th layer | TiO$_2$ | 96.89 |
| 68th layer | SiO$_2$ | 81.44 |

Furthermore, an antireflection layer 4 consisting of the constitution shown in Table 4 below is formed on the surface of the infrared absorption film 5.

TABLE 4

| | Material | Physical film thickness (nm) |
|---|---|---|
| 1st layer | TiO$_2$ | 11.53 |
| 2nd layer | SiO$_2$ | 44.26 |
| 3rd layer | TiO$_2$ | 36.7 |
| 4th layer | SiO$_2$ | 26.63 |
| 5th layer | TiO$_2$ | 344.43 |
| 6th layer | SiO$_2$ | 100.55 |

Thereafter, a resin layer 2 having a microlens array structure is formed on a surface of the light reflection film 3 of the dielectric multilayer film by the same method as in Example 1. Furthermore, an antireflection layer 4 consisting of the constitution shown in Table 4 above is formed on a surface of the resin layer 2 at a side having the microlens array structure formed thereon, to prepare the microlens array 10. The formation method of the infrared light absorption film 5 is as follows.

Figure 24:
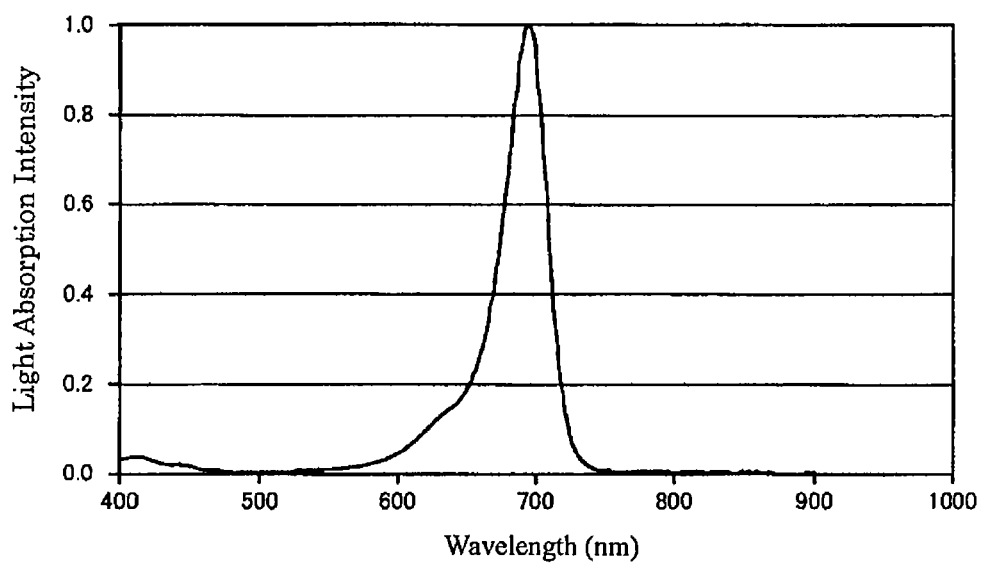
FIG. 24 is a view showing an absorption spectrum of an infrared ray absorbing dye used in one example of the present invention.

An infrared ray absorption dye in which absorption spectrum of light of a wavelength region of from 400 to 1,000 nm measured by dissolving in acetone has a pattern shown in FIG. 24, and a 50 mass % solution of an acrylic resin are mixed such a ratio that the infrared ray absorption dye is 0.8 parts by mass per 100 parts by mass of the acrylic resin, followed by stirring and dissolving at room temperature to thereby obtain a coating liquid. The coating liquid obtained is applied to a soda glass plate having a thickness of 1 mm by a die coating method using an applicator having a gap of 30 μm, and heated and dried at 100° C. for 5 minutes. Thereafter, the resulting coating film is cured by irradiating with ultraviolet rays having a wavelength of 365 nm in 360 mJ/cm$^2$ to form the infrared light absorption film 5 having a thickness of 8 μm.

The infrared light absorption film 5 formed is sufficiently cured.

Example 4

This example is one example of a microlens array 20 having the constitution illustrated in FIG. 15. That is, this example is an example in which a microlens array structure is formed on a surface of a transparent substrate 1 (more specifically, on an etching layer 12 formed on the surface of the transparent substrate 1). In this example, a silica (SiO$_2$; refractive index: 1.45 (wavelength: 550 nm)) layer and a titania (TiO$_2$; refractive index: 2.32 (wavelength: 550 nm)) layer are alternately stacked on one surface of a transparent substrate 1 that is a rectangular plate-shaped infrared ray absorption glass of 40 mm×40 mm×0.3 mm (NF-50 glass, manufactured by Asahi Glass Co., Ltd.) by a vacuum deposition method to form a light reflection film 3 of a dielectric multilayer film (34 layers) consisting of the constitution shown in Table 1 above.

Next, an SiO$_2$ film having a thickness of 2.5 μm is formed by sputtering as an etching layer 12 on the other surface of the transparent substrate 1 having the light reflection film 3 formed thereon. A resist material 2B is spin-coated at 1,300 rpm on the SiO$_2$ film 12 formed, and heated at 100° C. to form a resist film having a film thickness of 1.7 μm.

Next, the resist film obtained of the resist material 2B is irradiated with ultraviolet rays of 100 mJ/cm$^2$ by a high pressure mercury lamp in the state of interposing a photomask to cure the resist film. The resist film thus prepared is sufficiently cured. Thereafter, unexposed portion is removed by using a developer to obtain a resist pattern in which columns having a diameter of 31 μm and a height of 1.7 μm are arranged with 32 μm pitch on the transparent substrate 1.

Next, the columnar resist pattern obtained is heated at 200° C. to melt and molded so as to have the same shape as a microlens array structure. Thereafter, the SiO$_2$ film 12 is dry etched with a fluorine-based gas to obtain a transparent substrate 1 having the SiO$_2$ layer 12 (etching layer 12) on which convex spherical surface-shaped microlenses 11 having a curvature radius of 62.4 μm are arranged with 32 μm pitch.

Next, a three layer antireflection film 4 consisting of the constitution shown in Table 2 above is formed on the SiO$_2$ layer 12. Thus, the microlens array 20 having a microlens array structure formed on the infrared ray absorption glass substrate is obtained.

According to this example, as compared with the case where a light reflection film 3 is not formed, a curing time of a material of a photoresist used for transferring a shape of microlenses 11 to an etching layer 12 of a transparent substrate 1 can be shortened. As a result, a preparation time of a microlens array 20 can be shortened.

Example 5

This example is one example of a microlens array 20 having the constitution illustrated in FIG. 12. That is, this example is an example in which a microlens array structure is directly formed on a surface of a transparent substrate 1. In this example, a soda glass plate having a thickness of 0.3 mm is used as a transparent substrate 1 in place of an infrared ray absorption glass (NF-50 glass). This example is the same method as in Example 4, except that a soda glass is used and accordingly, an etching layer 12 is not necessarily provided. That is, in this example, a silica ($SiO_2$; refractive index: 1.45 (wavelength: 550 nm)) layer and a titania ($TiO_2$; refractive index: 2.32 (wavelength: 550 nm)) layer are alternately stacked on one surface of a rectangular plate-shaped soda glass of 40 mm×40 mm×0.3 mm by a vacuum deposition method to form a light reflection film 3 of a dielectric multilayer film (34 layers) consisting of the constitution shown in Table 1 above.

Next, a resist material 2B is spin-coated at 1,300 rpm on the other surface of the transparent substrate 1 having the light reflection film 3 formed thereon, and heated at 100° C. to form a resist film having a film thickness of 1.7 μm.

Next, the resist film obtained of the resist material 2B is irradiated with ultraviolet rays of 100 mJ/$cm^2$ by a high pressure mercury lamp in the state of interposing a photomask to cure the resist film. The resist film thus prepared is sufficiently cured. Thereafter, an unexposed portion is removed by using a developer to obtain a resist pattern in which columns having a diameter of 31 μm and a height of 1.7 μm are arranged with 32 μm pitch on the transparent substrate 1.

Next, the columnar resist pattern obtained is heated at 200° C. to melt and molded so as to have the same shape as a microlens array structure. Thereafter, the soda glass is dry etched with a fluorine-based gas to obtain the transparent substrate 1 having convex spherical surface-shaped microlenses 11 having a curvature radius of 62.4 μm arranged with 32 μm pitch thereon.

Next, a three layer antireflection film 4 consisting of the constitution shown in Table 2 above is formed on the surface of the transparent substrate 1 having the microlenses 11 formed thereon. Thus, a microlens array 20 having a microlens array structure formed on the soda glass plate is obtained.

According to this example, as compared with the case where a light reflection film 3 is not formed, a curing time of a material of a photoresist used for transferring a shape of microlenses 11 to a transparent substrate 1 can be shortened. As a result, a preparation time of the microlens array 20 can be shortened.

Example 6

This example is one example of a microlens array 10 having the constitution illustrated in FIG. 1. In this example, a resin layer 2 of a photosoluble resin 2C is used in place of the resin layer 2 of the photocurable resin 2A in Example 1.

At first, a light reflection film 3 of a dielectric multilayer film (34 layers) consisting of the constitution shown in Table 1 is formed on one surface of a transparent substrate 1 that is an infrared ray absorption glass (NF-50 glass, manufactured by Asahi Glass Co., Ltd.) in the same manner as Example 1.

Next, a photosoluble resin 2C that is a material of a resin layer 2 is spin-coated at 3,500 rpm as a photolithography material on the other surface of the transparent substrate 1 having the light reflection film 3 formed thereon, and heated at 90° C. to form a resin film having a film thickness of 1.4 μm. Here, an ultraviolet ray soluble acrylate-based resin having a refractive index of 1.50 is used as the photosoluble resin.

Next, the resin film obtained of the photosoluble resin 2C is irradiated with ultraviolet rays of 100 mJ/$cm^2$ by a high pressure mercury lamp in the state of interposing a photomask in which positions corresponding to spaces between a lens and a lens of the microlens 21 have been opened to perform a reaction. Thereafter, an exposed portion is removed by using a 2.38 mass % tetramethylammonium hydroxide aqueous solution. As a result, a pattern 2C in which columns having a diameter of 31 μm and a height of 1.4 μm of a resin from which an exposed portion has been removed are arranged with 32 μm pitch is obtained on the transparent substrate 1.

Next, the pattern 2C obtained is irradiated with ultraviolet rays of 200 mJ/$cm^2$ by a high pressure mercury lamp to react an unreacted PAC in the resin layer 2, thereby conducting bleaching.

Next, the pattern 2C after bleaching is heated at 170° C. and melted to form convex surface-shaped microlenses 21 having a curvature radius of 60.0 μm. As a result, the resin layer 2 having microlenses 21 arranged with 32 μm pitch is obtained on the transparent substrate that is an infrared ray absorption glass.

Residue of the resin is not present at spaces between a lens and a lens of the microlens array 10 thus prepared, and is sufficiently dissolved and removed.

Example 7

In this example, a microlens array 10 is manufactured in the same manner as in Example 6, except that an alkali-free glass plate having a thickness of 0.3 mm is used in place of the infrared ray absorption glass (NF-50 glass).

Residue is not present in a space of the resin layer 2 formed, and is sufficiently dissolved and removed.

Example 8

This example is an example of a microlens array 10 having the constitution illustrated in FIG. 9. In this example, a resin layer 2 of a photosoluble resin 2C is formed in place of the resin layer 2 of the photocurable resin 2A in Example 3. In this case, a rectangular plate-shaped alkali-free glass of 40 mm×40 mm×0.3 mm is used in place of the soda glass as a transparent substrate 1. A microlens array 10 is manufactured in the same manner as in Example 3, except that the transparent substrate 1 is an alkali-free glass and the resin layer 2 of a photosoluble rein is formed. As a method for forming the resin layer 2 of a photosoluble resin, the same method as in Example 6 is used.

Residue of the resin is not present at spaces between a lens and a lens of the microlens array 10 thus prepared, and is sufficiently dissolved and removed.

Example 9

This example is one example of a microlens array 20 having the constitution illustrated in FIG. 15. In this example, a resist material 2D is used as a material of a photoresist for transferring a shape of microlenses to a transparent substrate, in place of the resist material 2B in Example 4. Other points are the same as in Example 4.

In this example, the resist material 2D is spin-coated at 2,300 rpm on the SiO$_2$ film 12 formed, and heated at 90° C. to form a resist film having a film thickness of 1.7 µm. The resist film obtained is irradiated with ultraviolet rays of 100 mJ/cm$^2$ by a high pressure mercury lamp in the state of interposing a photomask to perform a reaction. Thereafter, an exposed portion is removed by using a developer to obtain a resist pattern in which columns having a diameter of 31 µm and a height of 1.7 µm of the resist material 2D on an unexposed portion are arranged with 32 µm pitch, on an infrared ray absorption glass (NF-50 glass, manufactured by Asahi Glass Co., Ltd.) substrate.

The resist pattern obtained is heated at 170° C., melted and molded so as to have the same shape as the microlens array structure. Thereafter, the SiO$_2$ film 12 is dry etched with a fluorine-based gas to obtain a transparent substrate 1 having the SiO$_2$ layer 12 (etching layer 12) having convex spherical surface-shaped microlenses 11 having a curvature radius of 62.4 µm arranged with 32 µm pitch. Next, a three-layered antireflection film 4 consisting of the constitution shown in Table 2 above is formed on the SiO$_2$ layer 12. Thus, a microlens array 20 having a microlens array structure formed on an infrared ray absorption glass substrate is obtained.

According to this example, as compared with the case where a light reflection film 3 is not formed, an exposure time of a material of a photoresist used for transferring the shape of the microlenses 11 to the etching layer 12 of the transparent substrate 1 can be shortened. As a result, a manufacturing time of the microlens array 20 can be shortened.

Example 10

This example is one example of a microlens array 20 having the constitution illustrated in FIG. 12. In this example, a resist material 2D is used as a material of a photoresist for transferring a shape of microlenses to a transparent substrate in place of the resist material 2B in Example 5. Furthermore, a rectangular plate-shaped alkali-free glass of 40 mm×40 mm×0.3 mm is used as a transparent substrate 1 in place of the soda glass. The microlens array 20 is manufactured in the same manner as in Example 5, except that the transparent substrate 1 is the alkali-free glass and a photoresist is formed using a photosoluble resin. A method for forming a photoresist imitating a lens shape by using the photosoluble resin as a material is the same as in Example 9. However, because an alkali-free glass is used as the transparent substrate 1, the method differs from Example 9 in that dry etching is performed by using a mixed gas of a fluorine-based gas and a chlorine-based gas.

Even by this example, as compared with the case where a light reflection film 3 is not formed, an exposure time of a material of a photoresist used for transferring a shape of microlenses 11 to the transparent substrate 1 can be shortened. As a result, a manufacturing time of the microlens array 20 can be shortened.

Example 11

This example is one example of a microlens array 10 having the constitution illustrated in FIG. 1. The microlens array 10 is manufactured in the same manner as in Example 6, except that a resin layer 2 of a photosoluble resin 2C is formed by using a grayscale photomask.

In this example, a photosoluble resin 2C that is a material of a resin layer 2 is spin-coated at 1,200 rpm as a photolithography material on the other surface of a transparent substrate 1 that is an infrared ray absorption glass (NF-50 glass, manufactured by Asahi Glass Co., Ltd.) having a light reflection film 3 of a dielectric multilayer film consisting of the constitution shown in Table 1 formed thereon, and heated at 100° C. to form a resin film having a film thickness of 2.1 µm. Here, an ultraviolet-ray-soluble siloxane-based resin having a refractive index of 1.50 is used as the photosoluble resin.

The resin film obtained of the photosoluble resin 2C is irradiated with ultraviolet rays of 300 mJ/cm$^2$ by a high pressure mercury lamp in the state of interposing a photomask 802 having a transmitted light intensity distribution corresponding to the microlens 21 to perform a reaction. Thereafter, an exposed portion is removed by using a 2.38 mass % tetramethylammonium hydroxide aqueous solution to obtain a resin layer 2 having a pattern 2C in which convex spherical surfaces having a curvature radius of 60.0 µm are arranged with 32 µm pitch, on a transparent substrate that is an infrared ray absorption glass.

The pattern 2C of the resin layer 2 obtained is irradiated with ultraviolet rays of 300 mJ/cm$^2$ by a high pressure mercury lamp to react unreacted PAC in the resin layer 2, thereby performing bleaching. The pattern 2C after bleaching is heated at 100° C. so that a reaction between resins in the resin layer 2 proceeds. The subsequent formation method of a three-layered antireflection film 4 and the like are the same as in Example 1.

Residue of a superfluous resin is not present on the surface of the microlens array 10 thus manufactured, and is sufficiently dissolved and removed.

Example 12

A microlens array 10 is manufactured in the same manner as in Example 11, except that an alkali-free glass plate having a thickness of 0.3 mm is used in place of the infrared ray absorption glass (NF-50 glass).

Residue is not present in a space of the resin layer 2 formed, and is sufficiently dissolved and removed.

Example 13

This example is one example of a microlens array 10 having the constitution illustrated in FIG. 9. The microlens array 10 is manufactured in the same manner as in Example 8, except that a resin layer 2 of a photosoluble resin 2C is formed by using a grayscale photomask. As a method for forming the resin layer 2 of a soluble resin 2C by using a grayscale photomask, the same method as in Example 11 is used.

Residue of a superfluous resin is not present on the surface of the microlens array 10 manufactured, and is sufficiently dissolved and removed.

Example 14

This example is one example of a microlens array 20 having the constitution illustrated in FIG. 15. In this example, the microlens array 20 is manufactured in the same manner as in Example 9, except that in Example 9, a photoresist for transferring a shape of microlenses to a transparent substrate is formed by using a grayscale photomask in place of a binary mask. A method for forming a photoresist imitating a lens shape from a resist material 2D by using a grayscale photomask may be a method for forming a resin layer 2 imitating a lens shape from a photosoluble resin 2C in Example 11.

Specifically, the $SiO_{2\ film\ 12}$ having a thickness of 2.5 µm is formed as an etching layer 12 on the other surface of a transparent substrate 1 that is an infrared ray absorption glass (NF-50 glass, manufactured by Asahi Glass Co., Ltd.) having a light reflection film 3 of a dielectric multilayer film having the constitution shown in Table 1 formed thereon. In such the state, the resist material 2D is spin-coated at 1,200 rpm on the $SiO_2$ film 12 and heated at 100° C. to form a resist film having a film thickness of 2.1 µm. The resist film obtained of the resist material 2D is irradiated with ultraviolet rays of 300 mJ/cm$^2$ by a high pressure mercury lamp in the state of interposing a photomask having a transmitted light intensity distribution corresponding to microlenses 21 to conduct a reaction. Thereafter, an exposed portion is removed by using a developer, and molded so as to have the same shape as a microlens array structure. The resist pattern of the resist material 2D on an unexposed portion thus obtained is irradiated with ultraviolet rays to react unreacted PAC in the resin layer 2, and a reaction between resins in the photoresist is then proceeded by heating. The subsequent steps are the same as in Example 9.

Even by this example, as compared with the case where a light reflection film 3 is not formed, an exposure time of a material of a photoresist used for transferring a shape of microlenses 11 to an etching layer 12 of a transparent substrate 1 can be shortened. As a result, a manufacturing time of the microlens array 20 can be shortened.

Example 15

This example of one example of a microlens array 20 having the constitution illustrated in FIG. 12. In this example, the microlens array 20 is manufactured in the same manner as in Example 10, except that in Example 10, a photoresist for transferring a shape of microlenses to a transparent substrate is formed by using a grayscale photomask in place of a binary mask. As a method for forming a resist pattern imitating a lens shape from a resist material 2D by using a grayscale photomask, the same method as in Example 14 is used. However, the method differs from Example 14 in that dry etching is conducted with a mixed gas of a fluorine-based gas and a chlorine-based gas by using an alkali-free glass as a transparent substrate 1 and, accordingly, an etching layer 12 is not necessarily be provided.

Even by this example, as compared with the case where a light reflection film 3 is not formed, an exposure time of a material of a photoresist used for transferring a shape of microlenses 11 to a transparent substrate 1 can be shortened. As a result, a manufacturing time of the microlens array 20 can be shortened.

Although the present invention has been described in detail and by reference to the specific embodiments, it is apparent to one skilled in the art that various modifications or changes can be made without departing the scope and spirit of the present invention.

This application is based on Japanese Patent Application No. 2012-169541 filed on Jul. 31, 2012, the content of which is incorporated herein by reference.

INDUSTRIAL APPLICABILITY

The present invention can shorten a formation time of a resin layer having a microlens array structure or a resist pattern used for transferring a shape of microlenses to a transparent substrate, and additionally can give ultraviolet ray/infrared ray cut filter function. As a result, not only productivity of a microlens array itself can be improved, but productivity and reliability of an image pickup device can be improved. Therefore, the present invention can be preferably applicable to an image pickup device such as a small-sized camera, incorporated in information appliances such as a digital still camera, a digital video camera, a mobile phone, a notebook type personal computer or PDA.

DESCRIPTION OF REFERENCE NUMERALS AND SIGNS 10, 20 Microlens array
1 Transparent substrate
2 Resin layer
11, 21 Microlens
12 Etching layer
3 Light reflection film
4 Antireflection film
5 Infrared light absorption film
6 Cover layer
100 Image pickup element package
200 Image pickup device

The invention claimed is:

1. A microlens array to be used in combination with a pixel array of an image pickup element, comprising:
   a transparent substrate;
   a resin layer provided on/above at least one surface of the transparent substrate, comprising a photosensitive resin and forming a plurality of microlenses; and
   a functional layer reflecting at least light for reacting the photosensitive resin, the functional layer is formed on a surface of the transparent substrate at a side on which the resin layer is not formed, or on the surface of the transparent substrate at the side on which the resin layer is formed and at a position nearer the transparent substrate than the resin layer.

2. The microlens array according to claim 1, wherein the photosensitive resin is a photocurable resin.

3. The microlens array according to claim 2, wherein the functional layer is a light reflection film comprising a dielectric multilayer film that reflects at least light of an ultraviolet ray wavelength region.

4. The microlens array according to claim 2, wherein the transparent substrate is an infrared ray absorption glass that absorbs light of an infrared wavelength region.

5. The microlens array according to claim 1, wherein the photosensitive resin is a photosoluble resin.

6. The microlens array according to claim 5, wherein the functional layer is a light reflection film comprising a dielectric multilayer film that reflects at least light of an ultraviolet ray wavelength region.

7. The microlens array according to claim 5, wherein the transparent substrate is an infrared ray absorption glass that absorbs light of an infrared wavelength region.

8. The microlens array according to claim 1, wherein the functional layer is a light reflection film comprising a dielectric multilayer film that reflects at least light of an ultraviolet ray wavelength region.

9. The microlens array according to claim 1, wherein the transparent substrate is an infrared ray absorption glass that absorbs light of an infrared wavelength region.

10. The microlens array according to claim 1, further comprising an infrared light absorption film containing an infrared ray absorber that absorbs light of an infrared wavelength region stacked on the transparent substrate.

* * * * *